US009954548B2

United States Patent
Illing et al.

(10) Patent No.: US 9,954,548 B2
(45) Date of Patent: Apr. 24, 2018

(54) ELECTRONIC SWITCHING AND PROTECTION CIRCUIT WITH A LOGARITHMIC ADC

(71) Applicant: Infineon Technologies AG, Neubiberg (DE)

(72) Inventors: Robert Illing, Finkenstein (AT); Christian Djelassi, Villach (AT); Markus Ladurner, Villach (AT); David Jansson, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/094,240

(22) Filed: Apr. 8, 2016

(65) Prior Publication Data

US 2017/0294922 A1 Oct. 12, 2017

(51) Int. Cl.
*H03M 1/00* (2006.01)
*H03M 1/38* (2006.01)

(52) U.S. Cl.
CPC .................... *H03M 1/38* (2013.01)

(58) Field of Classification Search
CPC ........ H02M 3/158; H02M 1/32; H02M 3/156; H02M 3/1588; H02M 3/33507; H02M 2001/0009; H02M 3/33569; H02M 2003/1566
USPC ............... 323/207, 266, 271, 272, 282–290; 341/155
See application file for complete search history.

(56) References Cited

U.S. PATENT DOCUMENTS

| 6,150,802 A * | 11/2000 | Andrews | H02M 3/156 |
| | | | 323/282 |
| 7,230,813 B1 * | 6/2007 | Canova | H02H 3/025 |
| | | | 361/93.1 |
| 7,656,634 B2 * | 2/2010 | Robertson | H03K 17/0822 |
| | | | 361/111 |
| 8,537,517 B1 * | 9/2013 | Banak | H02H 11/002 |
| | | | 361/93.1 |
| 8,547,675 B2 * | 10/2013 | Maier | G05F 1/569 |
| | | | 361/93.1 |
| 2006/0125672 A1 * | 6/2006 | Budzelaar | H03M 1/1235 |
| | | | 341/155 |
| 2009/0027020 A1 * | 1/2009 | Qiu | H02M 3/1588 |
| | | | 323/282 |

(Continued)

*Primary Examiner* — Linh Nguyen
(74) *Attorney, Agent, or Firm* — Slater Matsil, LLP

(57) ABSTRACT

An embodiment electronic circuit includes an electronic switch comprising a load path, a first protection circuit configured to generate a first protection signal based on a current-time-characteristic of a load current through the load path of the electronic switch, and a drive circuit configured to drive the electronic switch based on the first protection signal. The first protection circuit includes a logarithmic analog-to-digital converter (ADC) configured to receive an ADC input signal representing the load current and to output an ADC output signal that includes a sequence of values such that each of the values represents a respective sample of the ADC input signal, a filter configured to filter the ADC output signal and output a filter output signal, and a comparator circuit configured to generate the first protection signal based on comparing the filter output signal with a predefined threshold.

23 Claims, 20 Drawing Sheets

(56) References Cited

U.S. PATENT DOCUMENTS

| | | | |
|---|---|---|---|
| 2009/0121912 A1* | 5/2009 | Zanchi | H03M 1/0863 |
| | | | 341/172 |
| 2010/0208502 A1* | 8/2010 | Horii | H02M 3/33507 |
| | | | 363/131 |
| 2012/0133346 A1* | 5/2012 | Ogawa | H02M 3/1588 |
| | | | 323/282 |
| 2014/0292288 A1* | 10/2014 | Yan | H02M 3/156 |
| | | | 323/234 |
| 2015/0043115 A1* | 2/2015 | Ahmed | H02H 3/02 |
| | | | 361/71 |
| 2015/0180355 A1* | 6/2015 | Freeman | H02M 1/08 |
| | | | 363/21.04 |

* cited by examiner

ELECTRONIC SWITCHING AND PROTECTION CIRCUIT WITH A LOGARITHMIC ADC

TECHNICAL FIELD

This disclosure in general relates to an electronic switching and protection circuit, and more particularly to an electronic circuit which functions as an electronic switch and an electronic fuse.

BACKGROUND

A fuse is a protection device which trips dependent on a current and a time duration the current flows. For example, the fuse trips substantially instantaneously if the current is higher than a maximum current, does not trip if the current is a rated current or below the rated current, and trips after a delay time that is dependent on the current if the current is between the rated current and the maximum current. A fuse may be used to protect a load and a cable between a power source and the load. The function of a fuse can be implemented using an electronic switch, and a drive circuit.

SUMMARY

One example relates to an electronic circuit. The electronic circuit includes an electronic switch with a load path, a first protection circuit configured to generate a first protection signal based on a current-time-characteristic of a load current through the load path of the electronic switch, and a drive circuit configured to drive the electronic switch based on the first protection signal. The first protection circuit includes a logarithmic analog-to-digital converter (ADC) configured to receive an ADC input signal representing the load current and to output an ADC output signal that includes a sequence of values such that each of the values represents a respective sample of the ADC input signal, a filter configured to filter the ADC output signal and output a filter output signal, and a comparator circuit configured to generate the first protection signal based on comparing the filter output signal with a predefined threshold.

Another example relates to a method. The method includes generating a first protection signal based on a current-time-characteristic of a current through a load path of an electronic switch, and driving the electronic switch based on the first protection signal. Generating the first protection signal includes, by a logarithmic analog-to-digital converter (ADC), receiving an ADC input signal representing the load current and outputting an ADC output signal that includes a sequences of values such that each of the values represents a respective sample of the ADC input signals, filtering the ADC output signal and outputting a filter output signal by a filter, and generating the first protection signal based on comparing the filter output signal with a predefined threshold by a comparator circuit.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIG. 2 shows one example of the control circuit.

DETAILED DESCRIPTION OF ILLUSTRATIVE EMBODIMENTS

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
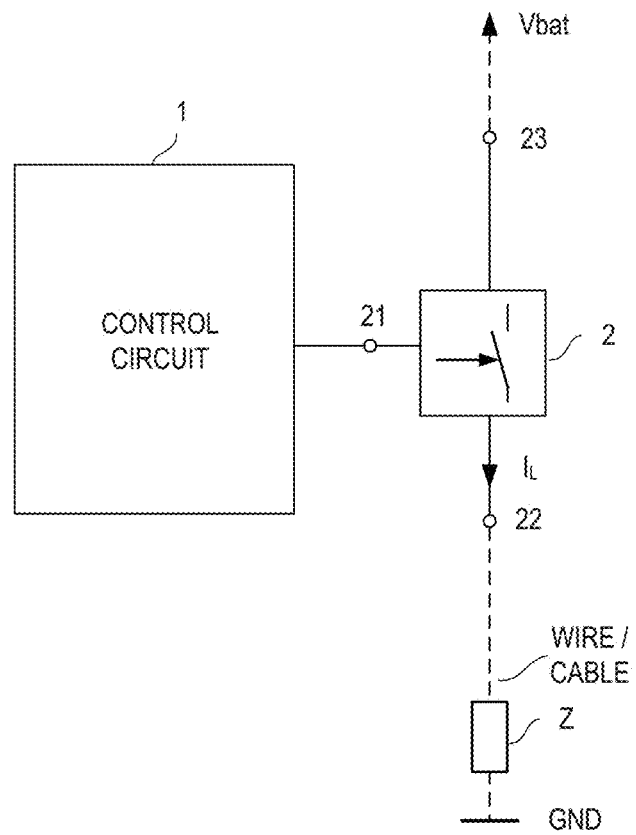
FIG. 1 schematically illustrates an electronic circuit with an electronic switch and a control circuit configured to drive the electronic switch.

FIG. 1 shows one example of an electronic circuit. The electronic circuit includes an electronic switch 2 with a control node 21 and a load path between a first load node 22 and a second load node 23. The electronic circuit further includes a control circuit 1 coupled to the control node 21 of the electronic switch 2 and configured to drive the electronic switch 2. The electronic circuit with the electronic switch 2 and the control circuit 1 can be monolithically integrated on one semiconductor die (chip) or can be integrated in two semiconductor dies that are arranged in one integrated circuit package. The electronic circuit is configured to drive a load Z (illustrated in dashed lines in FIG. 1) that can be connected in series with the load path of the electronic switch 2, wherein the series circuit with the electronic switch 2 and the load Z can be connected between supply nodes where a positive supply potential Vbat and a negative supply potential or ground potential GND is available. A voltage between the positive supply node and the negative supply node is referred to as supply voltage in the following.

In particular, the electronic circuit can be used to drive a load Z in a car. In this case, a power source that supplies the supply voltage Vbat is a car battery. "To drive a load" may include to switch on or off the load by switching on or off the electronic switch 2 in the electronic circuit. The load can be any of a variety of electric loads used in a car. Examples of the load Z include, but are not restricted to, different types of lights, different types of motors, relays, a heating system, or the like. In the example shown in FIG. 1, the electronic switch 2 and the load Z are connected in a high-side configuration. That is, the load Z is connected between the electronic switch 2 and the ground node GND. This, however, is only an example. The electronic switch 2 and the load Z could also be connected in a low side configuration or in any other configuration as well. In a low side configuration, for example, the load Z is connected between the electronic switch and the positive supply node.

Referring to FIG. 1, the load Z can be connected to the electronic switch 2 via an electrically conducting wire. Dependent on where the electronic circuit and the respective load Z are located in the car, the wire may have a considerable length of several 10 cm or even more. A modern car includes a plurality of electric loads, so that a plurality of wires are required to connect the individual loads to their respective electronic switch. In order to save costs and resources, it may be desirable to dimension the individual wires such that on a long range they withstand a current corresponding to a rated current of the respective load. If, however, the current rises above the rated current, the wire may be damaged or even destroyed due to overheating. According to one example, the control circuit 1 therefore has a function to monitor a load current $I_L$ through the electronic switch 2 and switch off the electronic switch 2 to protect the wire when an overload scenario is detected. An "overload scenario" is a scenario that may result in the wire being damaged or destroyed if the electronic switch 22 is not switched off to interrupt the connection between the power source and the wire. This is explained in further detail herein below. As the electronic circuit is configured to switch on and off the load Z and protect the wire, it is also referred to as switching and protection circuit in the following.

In FIG. 1, the electronic switch 2 is schematically drawn as a circuit block that includes a switch. In the following, the term "electronic switch" is meant to include any type of electronic switch or electronic switch arrangement that has a control node 21 and a load path between a first load node 22 and a second load node 23 and is configured to switch on and off dependent on a drive signal received at the control node 21. "To switch on" means to operate the electronic switch 2 in an on-state in which the electronic switch 2 is capable of conducting a current between the first load node 22 and the second load node 23. "To switch off" means to operate the electronic switch 2 in an off-state in which the electronic switch 2 is capable of preventing a current flow between the first load node 22 and the second load node 23. According to one example, the electronic switch 2 includes at least one transistor. The at least one transistor is, for example, a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or a HEMT (High Electron Mobility Transistor).

In the following, examples of the control circuit 1 and its function are explained with reference to drawings. In particular, the function of the control circuit 1 is explained with reference to functional blocks depicted in the drawings. It should be noted that these functional blocks represent the function of the control circuit 1 rather than its specific implementation. These functional blocks can be dedicated circuit blocks configured to perform the respective function explained below. However, it is also possible that the functions of the individual functional blocks are performed by a programmable circuit (processor) on which a dedicated software stored in a memory runs.

FIG. 2 shows one example of the control circuit 1. In this example, the control circuit 1 includes a first protection circuit 4 configured to generate a first protection signal S4 based on a current-time-characteristic of the load current $I_L$. "To generate the first protection signal S4 based on the current-time-characteristic of the load current $I_L$" may include that the first protection circuit, to generate the first protection signal S4, considers the current level of the load current $I_L$ and the current history. That is, the first protection circuit 4 evaluates the load current $I_L$ over a certain time period in order to generate the first protection signal S4. To be able to evaluate the load current $I_L$ the first protection circuit 4 receives a current measurement signal CS and generates the first protection signal S4 based on the current measurement signal CS. According to one example, the current measurement signal CS is proportional to the load current $I_L$. In the example shown in FIG. 2, the current measurement signal CS (which may also be referred to as current sense signal) is available at a sense output 24 of the electronic switch 2. In this case, a current measurement circuit configured to measure the load current $I_L$ and provide the current measurement signal CS is integrated in the electronic switch 2. However, this is only an example. A current measurement circuit separate from the electronic switch 2 can be used as well.

The control circuit 1 shown in FIG. 2 is configured to drive the electronic switch 2 based on the first protection signal S4 and an input signal $S_{IN}$ received at a first input node (input pin) $P_{IN}$ of the control circuit 1 and the electronic circuit, respectively. A drive circuit 3 receives the first protection signal S4 and the input signal $S_{IN}$ and generates a drive signal S3 based on the first protection signal S4 and the input signal $S_{IN}$. The drive signal S3 is received at the control node 21 of the electronic switch 2 and is configured to switch on or off the electronic switch 2. Optionally, a driver 51 is connected between the drive circuit 3 and the control node 21 of the electronic switch 2. According to one example, the drive signal S3 is a logic signal that has an on-level indicating that it is desired to switch on the electronic switch 2, or an off-level indicating that it is desired to switch off the electronic switch 2. The optional driver 51 is configured to drive the electronic switch 2 based on the respective signal level of the drive signal S3. The electronic switch 2, for example, includes a transistor, such as a MOSFET (as schematically illustrated in FIG. 2). A MOSFET is a voltage controlled semiconductor device that switches on or off dependent on a drive voltage applied between a gate node and a source node. In this example, the driver 51 is configured to generate the drive voltage based on the drive signal S3 in order to switch on or off the electronic switch 2 based on the drive signal S3.

Figure 3:
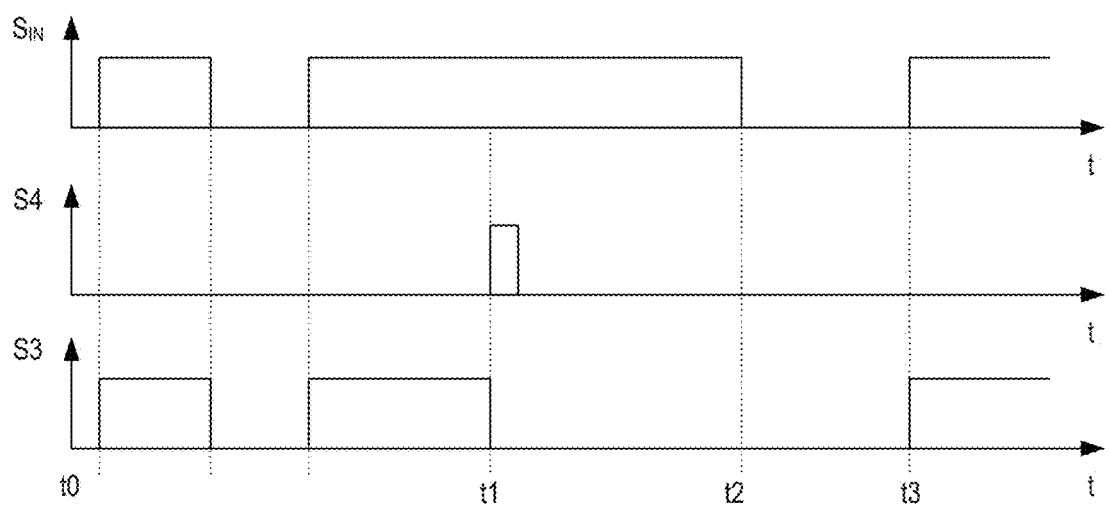
FIG. 3 shows one way of operation of a drive circuit in the control circuit shown in FIG. 2.

One way of operation of the control circuit 1, in particular of the drive circuit 3, is explained with reference to FIG. 3. FIG. 3 shows timing diagrams of the input signal $S_{IN}$, the first protection signal S4, and the drive signal S3. In the example shown, the input signal $S_{IN}$ is a logic signal that has an on-level or an off-level. An on-level of the input signal $S_{IN}$ indicates that it is desired to switch on the electronic switch 2, and an off-level indicates that it is desired to switch off the electronic switch 2. Just for the purpose of explanation, the on-level is a high logic level and the off-level is a low logic level in this example. Equivalently, the on-level of the drive signal S3 is drawn as a high level and the off-level is drawn as a low level in the example shown in FIG. 3. In this example, the first protection signal S4 is also a logic signal with two different signal levels. A signal level of the first protection signal S4, indicating that it is desired to switch off the electronic switch 2, is referred to as protection level or disable level (as it disables the drive circuit 3 to switch on the electronic switch 2) in the following. Just for the purpose of illustration, the protection level is a high logic level in the example shown in FIG. 3. The other signal level of the first protection signal S4 is referred to as enable level (as it enables the drive circuit 3 to drive the electronic switch 2 based on the input signal $S_{IN}$) in the following. The enable level is a low signal level in the present example.

Referring to FIG. 3, the drive circuit 3 is configured to drive the electronic switch 2 based on the input signal $S_{IN}$ if the first protection signal S4 has the enable level. That is, the drive circuit 3 switches on the electronic switch 2 when the signal level of the input signal $S_{IN}$ changes from the off-level to the on-level by generating an on-level of the drive signal S3, and switches off the electronic switch 3 when the signal level of the input signal $S_{IN}$ changes from the on-level to the off-level by generating an off-level of the drive signal S3. This is illustrated in FIG. 3 between time instances t0 and t1. The drive circuit 3 switches off the electronic switch 2 by changing the signal level of the drive signal S3 from the on-level to the off-level when the first protection signal S4 indicates that it is desired to switch off the electronic switch 3. This is shown in FIG. 3 at time instance t1 when the signal level of the first protection signal S4 changes to the protection level.

According to one example, the drive circuit 3 maintains the electronic switch 2 in the off-state even if the first protection signal S4 changes to the enable level and the input signal $S_{IN}$ has the on-level after time t1. That is, the drive circuit 3 is locked in an operation state that maintains the electronic switch 2 in the off-state until it is reset. According to one example, the drive circuit 3 is configured to again switch on the electronic switch 2, that is, to reset the drive circuit 3, only after the signal level of the input signal $S_{IN}$ has changed from the on-level to the off-level and back from the off-level to the on-level. In the example shown, the signal level of the input signal $S_{IN}$ changes to the off-level at time instance t2 and back to the on-level at time instance t3, wherein the electronic switch 2 is again switched on at time instance t3. According to one example, the drive circuit 3 is reset only if the off-level of the input signal $S_{IN}$ prevails for longer than a predefined time period before the input signal $S_{IN}$ changes to the on-level. That is, in the example shown in FIG. 3, the drive circuit is reset only if there is the predefined time period between time instances t2 and t3.

Figure 4:
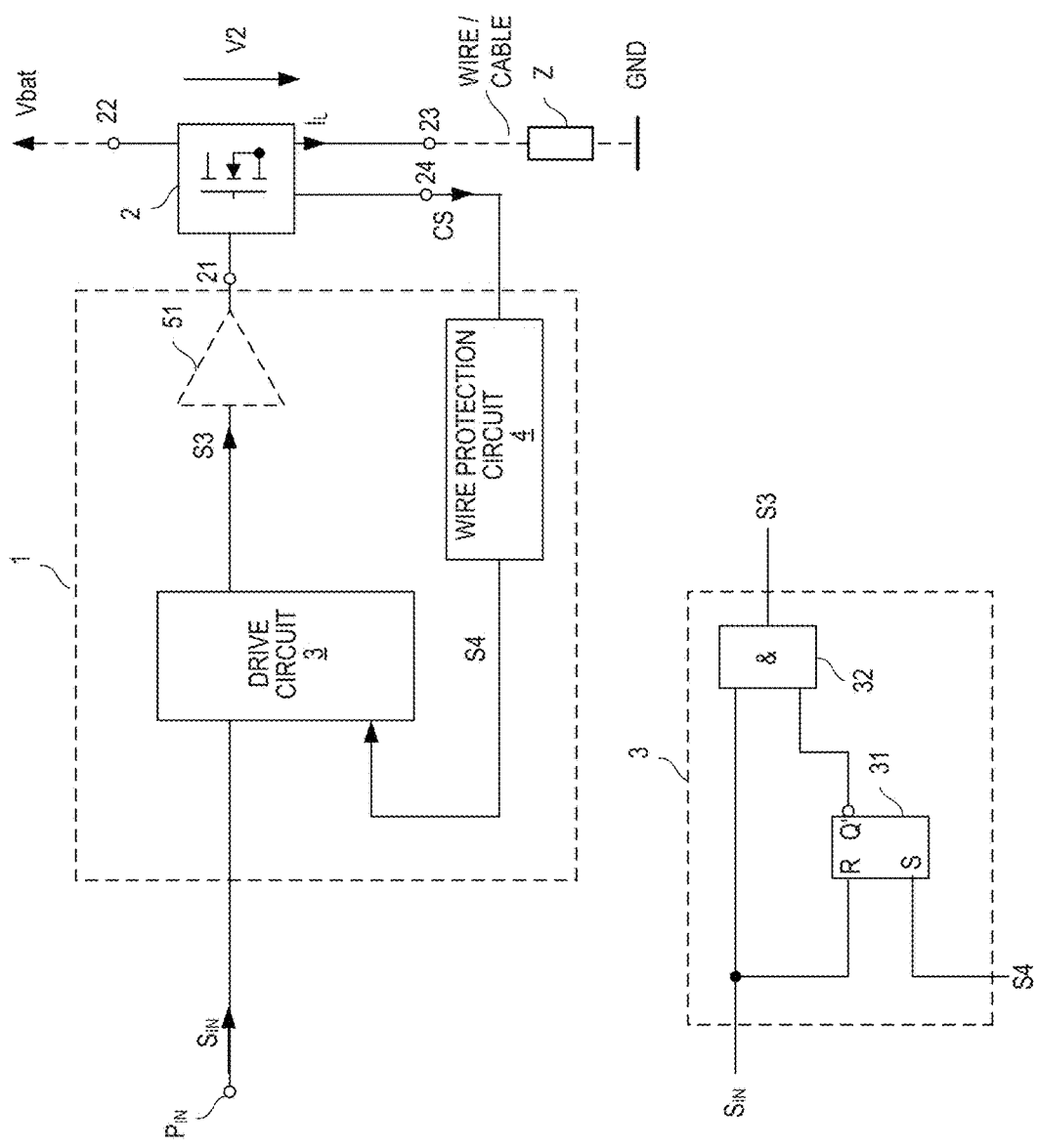
FIG. 4 shows one example of the drive circuit.

FIG. 4 shows one example of a drive circuit 3 configured to drive the electronic switch 2 in accordance with the timing diagrams shown in FIG. 3. In this example, the drive circuit 3 includes a latch 31, for example, an SR flip flop and a logic gate 32, for example, an AND gate. The SR flip flop receives the first protection signal S4 at a set input S, and the logic gate receives the input signal $S_{IN}$ and an output signal from an inverting output Q' of the flip flop 31. The input signal $S_{IN}$ is received by a reset input R of the flip flop 31. The flip flop 31 is set when the protection signal S4 changes from the enable level to the disable level (protection level) and is not reset until the input signal $S_{IN}$ changes from the off-level to the on-level. When the flip-flop 31 is set it changes the signal level of the drive signal S3 to the off-level via the logic gate 32 until the flip-flop is reset. After the flip-flop 31 has been reset, the drive signal S3 is again governed by the input signal $S_{IN}$ until the flip-flop 31 is set again.

Figure 5:
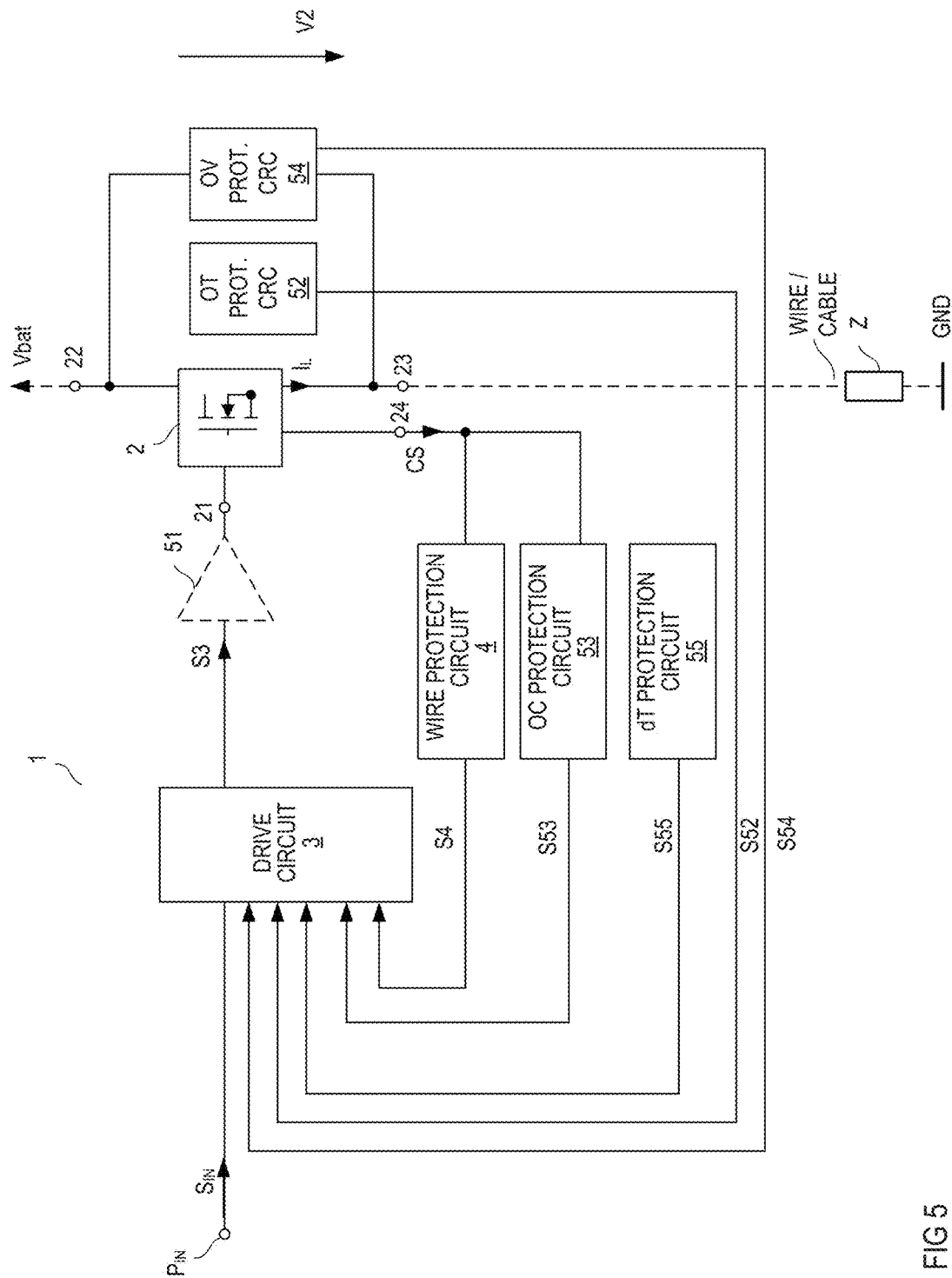
FIG. 5 shows another example of the control circuit.

According to another example, the first control circuit 1, additionally to the first protection circuit 4, includes at least one further protection circuit. FIG. 5 shows one example of the first control circuit 1 that includes four additional protection circuits, a second protection circuit 52, a third protection circuit 53, a fourth protection circuit 54, and a fifth protection circuit 55. These protection circuits are independent so it is not necessary to implement all of these protection circuits 52-55. That is, the control circuit 1 could be implemented to have only one, two, or three of these additional protection circuits 52-55.

According to one example, the second protection circuit 52, which may also be referred to as overtemperature protection circuit, is configured to measure a temperature of the electronic switch 2 and generate a second protection signal S52 received by the drive circuit 3 based on the measured temperature. According to one example, the second protection circuit 52 is configured to generate the second protection signal S52 to have a protection level (disable level) when the measured temperature is above a predefined overtemperature threshold, and an enable level when the measured temperature is below the overtemperature threshold. The protection level of the second protection signal S52 causes the drive circuit 3 to switch off the electronic switch 2, and the enable level causes the drive circuit 3 to drive the electronic switch 2 based on the input signal $S_{IN}$.

According to one example, the third protection circuit 53, which may also be referred to as overcurrent protection circuit, is configured to monitor the load current $I_L$ in order to detect an overcurrent and generate a third protection signal S53 based on this detection. In this example, the third protection circuit 53 receives the current measurement signal CS and is configured to compare the current measurement signal CS with an overcurrent threshold. The third protection circuit 53 is configured to generate a protection level of the third protection signal S53 when the current measurement signal CS is higher than the over current threshold, and an enable level of the third protection signal S53 when the current measurement signal CS is below the overcurrent threshold. The protection level of the third protection signal S53 causes the drive circuit 3 to switch off the electronic switch 2, and the enable level causes the drive circuit 3 to drive the electronic switch 2 based on the input signal $S_{IN}$.

According to one example, the fourth protection circuit 54, which may also be referred to as overvoltage protection circuit, is configured to measure a load path voltage V2 of the electronic switch 2 and generate a fourth protection signal S54 based on the measured load path voltage V2. According to one example, the fourth protection circuit 54 is configured to generate a protection level of the fourth protection signal S54 when the measured load path voltage V2 is higher than a predefined overvoltage threshold, and to generate an enable level of the fourth protection signal S54 when the measured load path voltage V2 is below the overvoltage threshold. A protection level of the fourth protection signal S54 causes the drive circuit 3 to switch on the electronic switch 2, and an enable level causes the drive circuit 3 to drive the electronic switch 2 based on the input signal $S_{IN}$. Switching on the electronic switch 2 at high voltages can protect the electronic switch 2 from being damaged or even destroyed.

According to one example, the fifth protection circuit 55, which may also be referred to as temperature difference protection circuit, is configured to generate a fifth protection signal based on a temperature difference between a temperature in the electronic switch 2 and a temperature in the control circuit 1. According to one example, the fifth protection circuit 55 is configured to generate a protection level of the fifth protection signal S55 when the temperature difference is higher than a predefined temperature difference threshold. The fifth protection circuit 55 may include a first temperature sensor in the electronic switch 2 and a second temperature sensor in the control circuit 1 to measure the temperature in the electronic switch 2 and the control circuit 1, respectively. According to one example, the overtemperature protection circuit 52 and the temperature difference protection circuit 52 may use the same temperature sensor.

According to one example, the drive circuit 3 is configured to operate the electronic switch 2 based on each of the protection signals S4, S52-S55 in the same way as explained before with reference to FIG. 3. That is, the drive circuit 3 can be configured, after the electronic switch 2 has been switched off due to one of the protection signals S4, S52-S54, to again switch on the electronic switch 2 only after the input signal $S_{IN}$ has changed to the off-level and back to the on-level.

Figure 6:
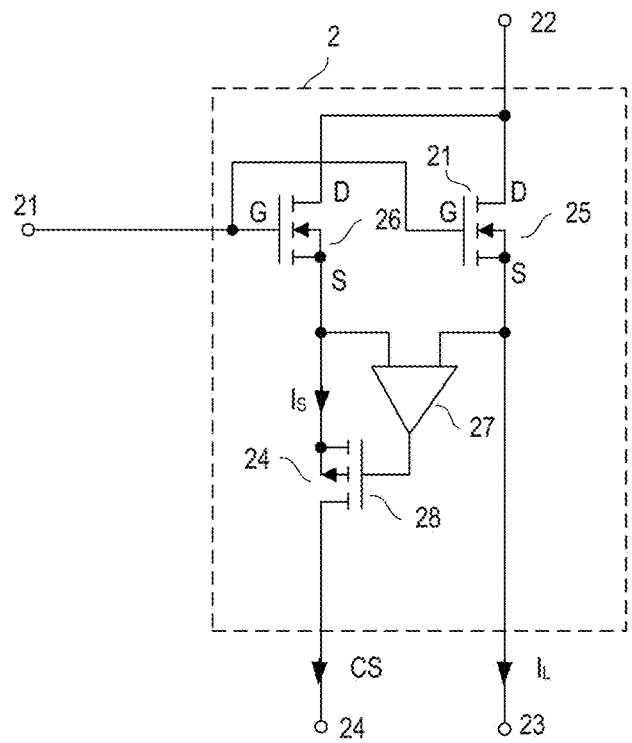
FIG. 6 shows one example of the electronic switch.

FIG. 6 shows one example of the electronic switch 2. In this example, the electronic switch 2 includes a first transistor 25, which is referred to as load transistor in the following, and a second transistor 26, which is referred to as sense transistor in the following. The load transistor 25 and the sense transistor 26 are transistors of the same transistor type. Just for the purpose of illustration, the load transistor 25 and the sense transistor 26 are MOSFETs, in particular n-type MOSFETs, in the example shown in FIG. 6. The load transistor 25 has a load path (drain-source path) between a drain node D and a source node S. The load path of the load transistor 25 forms the load path of the electronic switch 2. That is, the load path of the load transistor 25 is connected between the first load node 22 and the second load node 23 of the electronic switch 2. A gate node G of the load transistor 25 is connected to the control node 21 of the electronic switch 2. A gate node G of the second transistor 26 is connected to the control node 21, and a drain node D of the second transistor 26 is connected to the drain node D of the first transistor 25. Referring to the above, a MOSFET, such as the load transistor 25 and the sense transistor 26, is a voltage controlled semiconductor device that is driven dependent on a drive voltage (gate-source voltage) received between the gate node G and the source node S. When the first transistor 25 is in the on-state after receiving a drive voltage that is above a threshold voltage of the first transistor 25 from the control circuit 1, the load transistor 25 conducts a load current $I_L$. In the electronic switch 2 shown in FIG. 6, the sense transistor 26 is operated in the same operating point as the first transistor 25, so that a sense current $I_S$ through the second transistor 26 is proportional to the load current $I_L$. A proportionality factor between the load current $I_L$ and the sense current $I_S$ is given by a ratio between a size of the load transistor 25 and a size of the sense transistor 26. According to one example, each of the load transistor 25 and the sense transistor 26 includes a plurality of transistor cells. In this case, a proportionality factor $k_{ILIS}=I_L/I_S$ between the load current $I_L$ and the sense current $I_S$ is given by a ratio between the number of transistor cells $n_{25}$ of the first transistor 25 and the number of transistor cells $n_{26}$ of the second transistor 26, that is, $k_{ILIS}=n_{25}/n_{26}$.

In the electronic switch 2 shown in FIG. 6, the second transistor 26 is operated in the same operating point as the first transistor 25 by a regulation circuit. The regulation circuit includes a variable resistor 28 that is controlled by an operational amplifier 27 such that an electric potential at the source node S of the second transistor 26 equals the electric potential at the source node S of the first transistor 25. For this, the operational amplifier 27 receives the source potential of the first transistor 25 and the source potential of the second transistor 26 at an input. According to one example, the variable resistor 28 is a MOSFET, in particular, a p-type MOSFET 28. In the electronic switch 2 shown in FIG. 6, the current measurement signal CS equals the sense current $I_S$.

Figure 7:
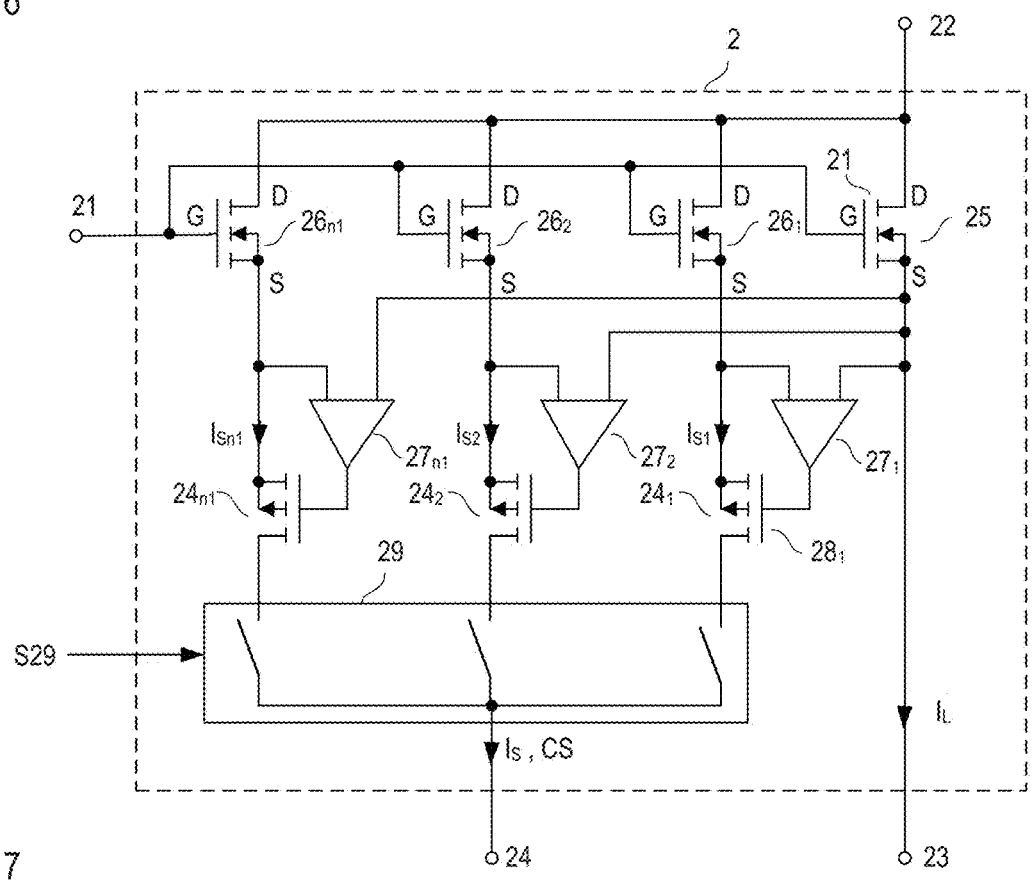
FIG. 7 shows another example of the electronic switch.

FIG. 7 shows a modification of the electronic switch 2 shown in FIG. 6. In this example, the electronic switch 2 includes two or more sense transistors $26_1$-$26_{n1}$. Each of these sense transistors $26_1$-$26_{n1}$ has its gate node connected to the control node 21 and its drain node connected to the drain node D of the load transistor 25. Each of the sense transistors $26_1$-$26_{n1}$ is operated in the same operation mode as the first transistor 25. For this, a regulation circuit $27_1$-$27_{n1}$, $28_1$-$28_{n1}$ corresponding to the regulation circuit 27, 28 shown in FIG. 6, is coupled between the respective source node S of each sense transistor $26_1$-$26_{n1}$ and the source node of the load transistor 25. Each of these regulation circuits $27_1$-$27_{n1}$, $28_1$-$28_{n1}$ operates the associated sense transistor $26_1$-$26_{n1}$ in the same operating point as the load transistor 25, so that sense currents $I_{S1}$-$I_{Sn1}$ provided by the individual sense transistors $26_1$-$26_{n1}$ are proportional to the load current $I_L$. An overall sense current $I_S$ (which equals the current measurement signal CS) is generated from the individual sense currents $I_{S1}$-$I_{Sn1}$ by a selection circuit 29. This selection circuit receives the individual sense currents $I_{S1}$-$I_{Sn1}$ and, based on a selection signal S29, passes one or more of the sense currents $I_{S1}$-$I_{Sn1}$ through to an output where the overall sense signal is available. In general, the overall sense current $I_S$ is given by $$I_S = \sum_{i=0}^{n1} a_i I_{Si} \quad (1),$$

where $a_i$ is either 0 or 1 and is dependent on the selection signal S29. In the electronic switch 2 shown in FIG. 7, the proportionality factor $k_{ILIS}$ can be adjusted by the selection signal S29. According to one example, the sense transistors $26_1$-$26_{n1}$ have the same size, so that different proportionality factors ($k_{ILIS}$ factors) can be adjusted by varying the number of sense transistors that are coupled to the output of the selection circuit 29. According to another example, the sense transistors $26_1$-$26_{n1}$ have different sizes, so that different $k_{ILIS}$ factors can be adjusted by varying the number of sense transistors that are coupled to the output of the selection circuit 29 and by selecting which of the sense transistors $26_1$-$26_{n1}$ is/are coupled to the output of the selection circuit 29.

Figure 8:
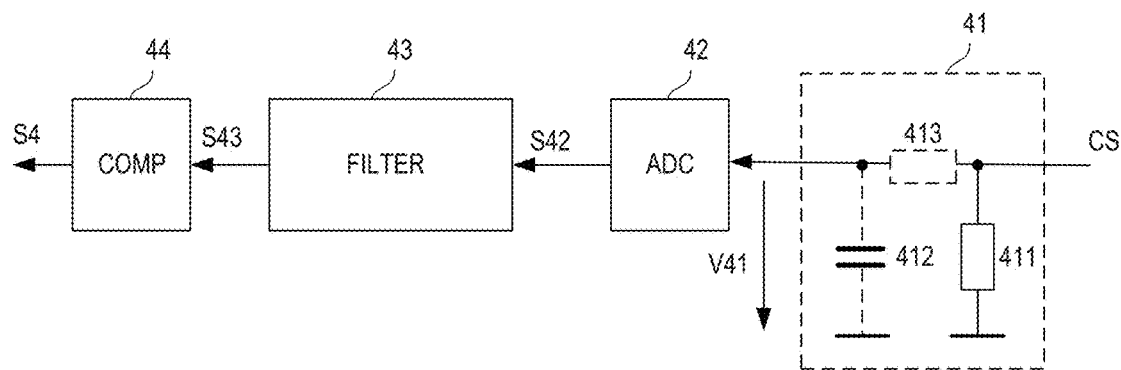
FIG. 8 shows one example of a first protection circuit included in the control circuit.

FIG. 8 shows one example of the first protection circuit 4 configured to generate the first protection signal S4 based on the current measurement signal CS. In the example shown in FIG. 8, the first protection circuit 4 includes a current-to-voltage converter 41 that receives the current measurement signal CS and generates a measurement voltage V41. According to one example, the current-to-voltage converter 41 includes a resistor 411 that receives the current measurement signal CS (which equals the sense current $I_S$), and the measurement voltage V41 is a voltage across the resistor 411. Optionally, an RC circuit with a capacitor 412 and another resistor 413 is connected in parallel with the resistor 411. This RC circuit 412, 413 may serve to filter undesired voltage spikes of the measurement voltage V41. If the RC circuit is employed, the measurement voltage V41 is the voltage across the capacitor 412 of the RC circuit.

An analog-to-digital converter (ADC) 42 receives the measurement voltage V41 as an ADC input signal and outputs an ADC output signal S42 based on the input signal V41. A filter 43 receives the ADC output signal S42 and generates a filter output signal S43 from the ADC output signal S42. A comparator circuit 44 receives the filter output signal S43 and generates the first protection signal S4 based on the filter output signal S43.

Figure 9:
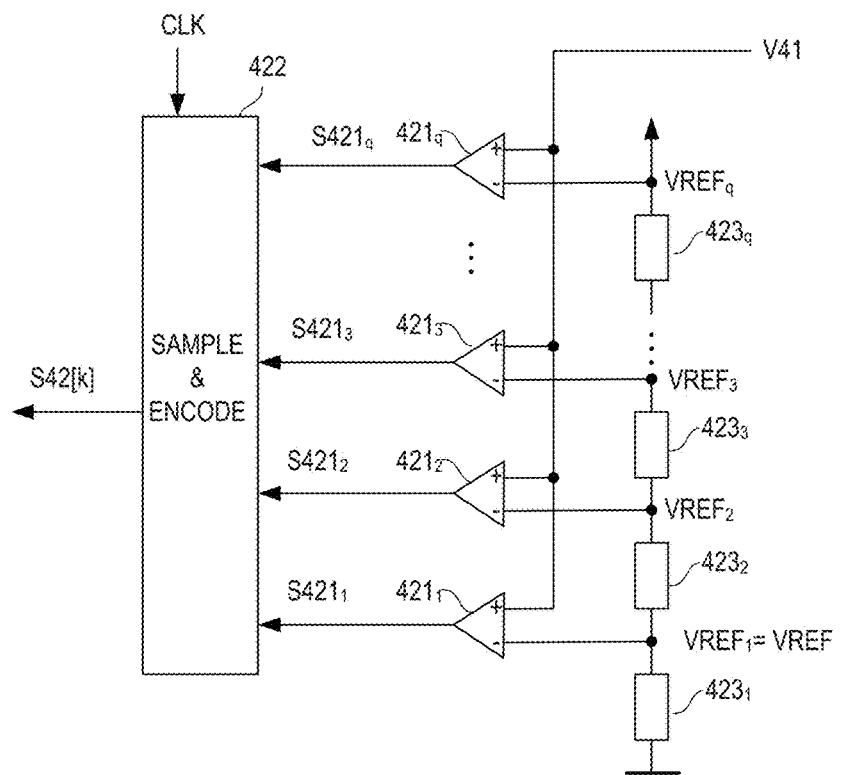
FIG. 9 shows one example of an analog-to-digital converter (ADC) in the first protection circuit shown in FIG. 8.

FIG. 9 shows one example of the ADC 42. In this example, the ADC 42 includes a plurality of comparators $421_1$-$421_q$. Each of these comparators $421_1$-$421_q$ receives the input signal V41 at a first input and a respective reference voltage $VREF_1$-$VREF_q$ at a second input. In the present example, the first input is a non-inverting input and the second input is an inverting input of the respective comparator $421_1$-$421_q$. The reference voltages $VREF_1$-$VREF_q$ are different. According to one example (as shown in FIG. 9), the reference voltages $VREF_1$-$VREF_q$ are generated using a series circuit with a plurality of resistors $423_1$-$423_q$. This series circuit receives a reference voltage which can be equal to the reference voltage $VREF_q$ received by one $421_q$ of the comparators. The other reference voltages $VREF_1$-$VREF_4$ are available at taps of the series circuit. A sampling and encoding circuit 422 receives comparator signals $S421_1$-$S421_q$ from the comparators $421_1$-$421_q$, samples these comparator signals $S421_1$-$S421_q$ in accordance with a clock signal CLK, and generates the ADC output signal S42 in accordance with the sample values obtained by sampling the comparator signals $S421_1$-$S421_q$. Each of the comparator signals $S421_1$-$S421_q$ is available at the output of a respective comparator $421_1$-$421_q$ and indicates whether or not the input signal V41 is higher than the reference voltage $VREF_1$-$VREF_q$ received by the respective comparator $421_1$-$421_q$.

The reference voltages $VREF_1$-$VREF_q$ define q+1 voltage intervals, $<V_{REF1}$, $[V_{REF1}, V_{REF2}]$, $[V_{REF2}, V_{REF3}]$, ..., $[V_{REFq-1}, V_{REFq}]$ and $>V_{REFq}$. The comparator signals $S421_1$-$S421_q$ together define a state of the ADC, wherein the ADC can have q+1 different states, each associated with one of the voltage intervals explained before. The ADC, for example, is in a first state when the input signal V41 is in the first interval $<V_{REF1}$, in a second state when the input signal V41 is in the second interval $[V_{REF1}, V_{REF2}]$, and so on. The encoding circuit 422 is configured to map the different states of the ADC 42 to the output signal S42. According to one example, the output signal S42 includes a series S42[k] of digital words, with each of these digital words S42[k] representing the state of the ADC at one sampling time. The sampling times are defined by the clock signal CLK.

According to one example, the ADC is a linear ADC. In this case, each of the reference voltages $VREF_1$-$VREF_q$ is given by i·VREF, where i is selected from 1, 2, 3, 4, . . . , q. The sample and encoding circuit 422, for example, is configured to generate the digital words S42[k] of the output signal S42 such that the digital word represents the voltage interval which the input signal V41 is in at the sampling time. The binary word output by the sampling and encoding circuit 422, for example, is zero if the input signal V41 is in the first interval (below $V_{REF1}$), is 1 if the input signal V41 is in the second interval (higher than $V_{REF1}$, but lower than $V_{REF2}$), and so on. In the case of a linear ADC, the input voltage V41 at the sampling time is approximately (that is, when a quantization error is neglected), $$V41[k] = S42[k] \cdot VREF \quad (2)$$

The number of bits of the binary word S42[k] output by the ADC is dependent on the different states the ADC can assume. According to one example, the ADC can have sixteen different states. In this case, the binary word has p=4 (=ld(16), where ld=$\log_2$) bits.

According to another example, the ADC is a logarithmic ADC. In this case, each of the reference voltages $VREF_1$-$VREF_q$ is a multiple of the next lower reference voltage. That is, $VREF_i = z \cdot VREF_{i-1}$, where i is selected from 1, 2, 3, 4, . . . , q. For example, z=2. In this case, each of the reference voltages $VREF_1$-$VREF_q$ can be expressed as $$VREF_i = 2^{i-1} \cdot VREF_1 = 2^{i-1} \cdot VREF_1.$$

Figure 10A:
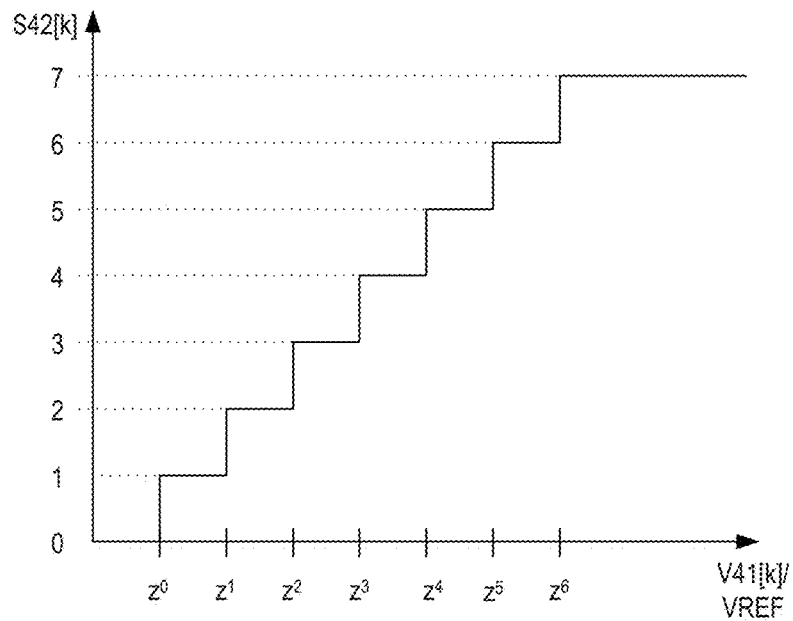
FIGS. 10A and 10B show characteristics of the ADC according to one example.
Figure 10B:
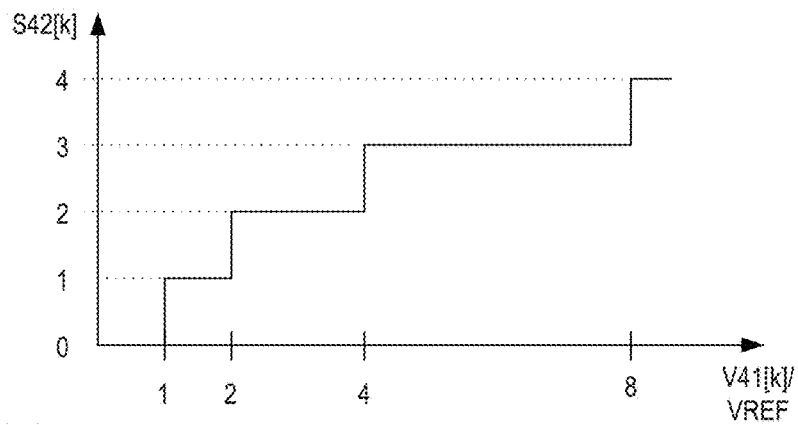

FIG. 10A shows one example of the characteristic curve of a logarithmic ADC. That is, FIG. 10A shows the decimal equivalent of the binary word S42[k] output by the ADC 42 at a sampling time k dependent on the value of the input signal V41[k] at the sampling time k. In FIG. 10A, the input signal is drawn on a logarithmic scale. FIG. 10B shows a section of the curve shown in FIG. 10A on a linear scale if z=2. To ease illustration, FIG. 10A shows the characteristic curve of a logarithmic ADC with 8 different states and a 3 bit output. This, however, is only an example. The characteristic curve of a logarithmic ADC with, for example, 16 states and a 4 bit can easily be derived from the curve shown in FIG. 10A.

In a logarithmic ADC with a characteristic curve shown in FIG. 10A the binary word S42[k] output at one sampling time k is associated with the input signal V41[k] at the sampling time k as follows, $$V41[k] = 0 \text{ if } S42[k] = 0 \quad (3a)$$

$$(3b) \quad V41[k] = z^{S42[k]-1} \cdot VREF \text{ if } S42[k] \neq 0$$

Thus, if the input signal V41[k] is different from zero, in particular is larger than VREF, S42[k] represents the logarithm of V41[k] to base z. According to one example, z=2. More precisely, as the number of bits of the ADC output signal S41 is limited (finite), S42[k] represents the rounded logarithm of V41[k] to base z.

As the ADC input signal V41 represents the current measurement signal CS and the current measurement signal CS represents the load current $I_L$, the ADC output signal S41 represents the load current $I_L$. According to one example, the first protection circuit 4 is configured to protect the wire between the electronic switch 2 and the load Z from being overheated. In this example, the filter 43 is configured to approximate the temperature of the wire based on the samples of the current measurement signal CS provided by the ADC 42. It can be shown that a temperature $T_W$ in the cable is given by $$T_W[k]=(1-\alpha)\cdot T_W[k-1]+R_{EL}\cdot R_{TH}\cdot I_L^2[k]\cdot \alpha \qquad (4a)$$

where $T_W[k]$ is the temperature at one sampling time, $T_W[k-1]$ is the temperature at the preceding sampling time, $I_L^2[k]$ is the square of the load current $I_L$ at the sampling time, $R_{EL}$ is the electric resistance of the wire and $R_{TH}$ is the thermal resistance of the wire. $1-\alpha$ is between 0 and 1 and considers a duration of one sampling period, that is, a time difference between the two sampling times k and k−1 and the heat radiation of the wire. In general, $1-\alpha$ decreases as the sampling frequency decreases. Furthermore, the better the wire can radiate energy in form of heat to the environment, the lower $1-\alpha$ is. According to one example, $$\alpha = 1 - e^{\frac{-\Delta t}{\tau}} \qquad (4b)$$

where $\Delta t$ is the time difference between the two sampling times k and k−1 and $\tau$ is a time constant of the cable that defines how fast energy introduced into the cable is dissipated in form of heat. $R_{EL}$, $R_{TH}$ and $\tau$ are constants and dependent on the specific type of wire, the material of the wire, the wire diameter, or the like. Applying some mathematical transformations, equation (4a) can be transformed into $$\frac{T_W[k]}{R_{EL}\cdot R_{TH}\cdot a} = \beta \cdot T_W[k] = (1-a)\cdot T_W[k-1] + I_L^2[k]. \qquad (4c)$$

That is, a weighted temperature $\beta\cdot T_W[k]$ of the wire at sampling time k is only dependent on the temperature at sampling time k−1, the square of the load current $I_L$ at sampling time k, and $1-\alpha$. $\alpha$, $R_{EL}$ and $R_{TH}$ are included in the weighting factor $\beta$.

It should be noted, that $T_W[k]$ and $T_W[k]$ do not represent absolute temperatures of the wire, but temperature changes caused by the load $I_L$ flowing through the cable. That is, $T_W[k]$ and $T_W[k]$ can be zero if the load current $I_L$ is zero or if the load current $I_L$ has been zero long enough for the energy introduced into the cable by the load current $I_L$ to completely dissipate.

Figure 11:
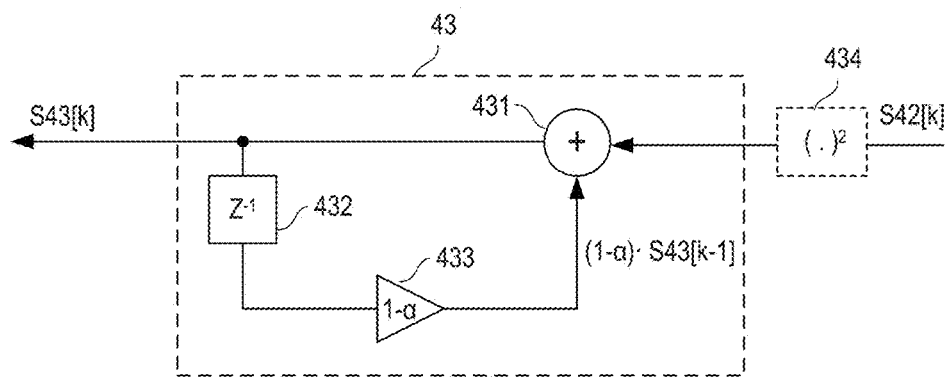
FIG. 11 shows one example of a filter in the first protection circuit shown in FIG. 8.

FIG. 11 shows one example of the filter 43. The filter shown in FIG. 11 is based on the assumption that the ADC 42 is a logarithmic ADC explained above. That is, the ADC is configured to generate the ADC output signal S42 based on comparing the input signal V41 with a plurality of different reference voltages ($VREF_1$-$VREF_q$ in FIG. 9), wherein a ratio between each reference voltage $VREF_1$ and the next lower reference voltage $VREF_{i-1}$ is given by z (which is 2, for example). In this case, the ADC output signal S42 represents a logarithm of the load current $I_L$. As the logarithm of the load current is proportional to the logarithm of the square of the load current ($\log_z(I_L^2)=2\cdot\log_z(I_L)$) the ADC output signal S42 also represents the square of the load current $I_L$. Thus, when using a logarithmic ADC 42, there is no need to calculate the square of a signal representing the load current $I_L$ in the filter 43. This helps to reduce the size required to implement the filter 43 in the electronic circuit.

If the ADC output signal S42 represents the load current $I_L$ instead of the square of the load current $I_L$, the square of the signal S42 is calculated by a calculation unit 434 (illustrated in dashed lines in FIG. 11). However, for the purpose of explanation, it is assumed that the ADC output signal S42 represents the logarithm of the load current $I_L$ so that the calculation unit 434 can be omitted.

The filter 43 shown in FIG. 11 is configured to calculate each value S43[k] of the filter output signal S43 based on the ADC output signal S42 as follows, $$S43[k]=(1-\alpha)\cdot S43[k-1]+S42[k] \qquad (5).$$

In equations (4) and (5) k and k−1 denote discrete time variables (discrete sampling times). Referring to the above, the ADC output signal S42 and the filter output signal S43 each include a sequence of binary words, wherein a new value is output in each new clock cycle. According to one example, the filter 43 operates in accordance with the same clock signal CLK that governs sampling the input signal V42, representing the current measurement signal CS in the ADC 42. According to one example, k denotes a sampling time in one clock cycle and k−1 denotes a sampling time in a clock cycle directly preceding clock cycle k. Thus, in equation (5), S43[k] denotes the filter value output in one clock cycle k, S43[k−1] denotes the filter value output in the preceding clock cycle k−1, and S42[k] denotes the ADC output value in clock cycle k. Comparing equations (5) and (4c), it can be seen that the filter output signal S43 represents the weighted wire temperature $\beta\cdot T_W[k]$ if the filter input signal S42[k] represents the square of the load current $I_L$.

One example of a filter 43 configured to generate the filter output signal S43 in accordance with equation (5) is shown in FIG. 11. This filter 43 includes an adder 431 that receives the ADC output signal S42 and the output signal of a feedback loop. The feedback loop includes a delay element 432 and a multiplier 433. The delay element 432 receives the filter output signal S43 and delays the filter output signal for one clock cycle. The multiplier 433 multiplies the delayed filter output signal S43 with $1-\alpha$ so that the output signal of the feedback loop equals $(1-\alpha)\cdot S43[k-1]$. Of course, the position of the delay element 432 and the multiplier 433 in the feedback loop can be changed.

Figure 12:
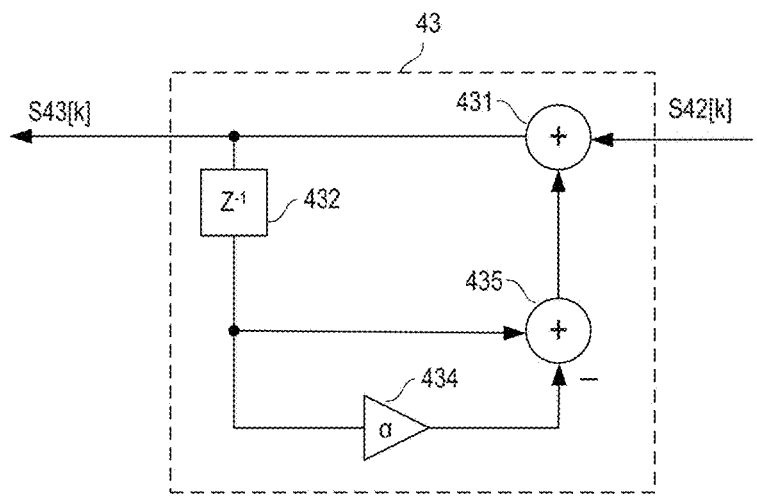
FIG. 12 shows another example of the filter in the first protection circuit shown in FIG. 8.

FIG. 12 shows a modification of the filter 43 shown in FIG. 11. Instead of multiplier 433 that multiplies the delayed filter output value S43[k−1] with $1-\alpha$, the filter 43 shown in FIG. 12 includes a multiplier 434 that multiplies the delayed filter output value S43[k−1] with a and a subtractor 435 that subtracts the output signal of the multiplier 434 from the delayed filter output value S43[n−1]. According to one example, a is $2^{-N}$, where N is an integer. In this case, the multiplication performed by the multiplier 434 can be performed by a simple register shift operation. This is explained with reference to FIG. 13.

Figure 13:
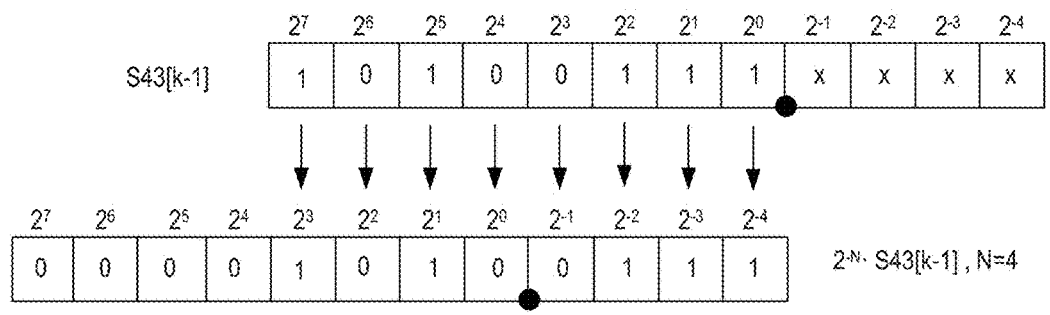
FIG. 13 illustrates operation of a multiplier included in the filter shown in FIG. 12.

FIG. 13 shows one example of the delayed filter output value S43[k−1]. Just for the purpose of explanation, it is assumed that the filter output values are binary words with twelve bits from which eight bits represent the integer portion, and four bits represent the portion of the output value smaller than one. The result of multiplying S43[k−1] with $2^{-N}$ (where N=4 in the example shown) can be obtained by simply shifting the bits of S43[k−1] N positions to the right.

Figure 14:
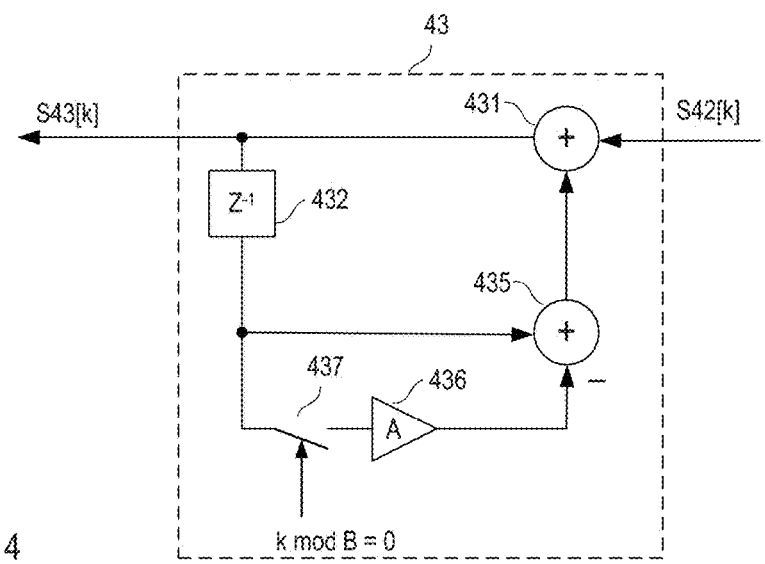
FIG. 14 shows another example of the filter in the first protection circuit shown in FIG. 8.

FIG. 14 shows a modification of the filter 43 shown in FIG. 12. In the filter shown in FIG. 14, the delayed output value S43[k−1] is multiplied with a factor A by a multiplier 436 and subtracted from S43[k−1] only once in B clock cycles. In FIG. 14, this is represented by a switch 437 that is closed only once in B clock cycles, that is, when k mod B=0, where k denotes the clock cycle, mod denotes a modulo operation, and B denotes how many clock cycles are allowed to pass before the switch 436 switches on. Under the assumption that the load current $I_L$ does not significantly change within B clock cycles, so that S43 is essentially constant over B clock cycles, the filter 43 calculates the output value S43[k] in accordance with equation (5), where α=A/B. For example, $A=2^{-N}$, so that the multiplication performed by multiplier 436 can be realized by a shift operation explained with reference to FIG. 13. Nevertheless, using the switch 437 allows to have values of α different from $2^{-N}$.

The filter explained with reference to FIGS. 11, 12 and 14, in particular in combination with a logarithmic ADC, is capable of calculating a weighted temperature of the cable at one sampling time k based on additions and/or subtractions and does not require a multiplication. In particular, it is not required to multiply the filter input signal S42[k], which represents the square of the load current $I_L$ when a logarithmic ADC is used, with wire dependent parameters such as $R_{EL}$, $R_{TH}$ or α, as implied by equation (4a). Nevertheless, these wire dependent parameters are included in the filter output signal S43[k] which represents a weighted temperature of the wire. More specifically, the filter output signal S43[k] represents a weighted increase of the temperature resulting from a current flowing through the wire.

Figure 15:
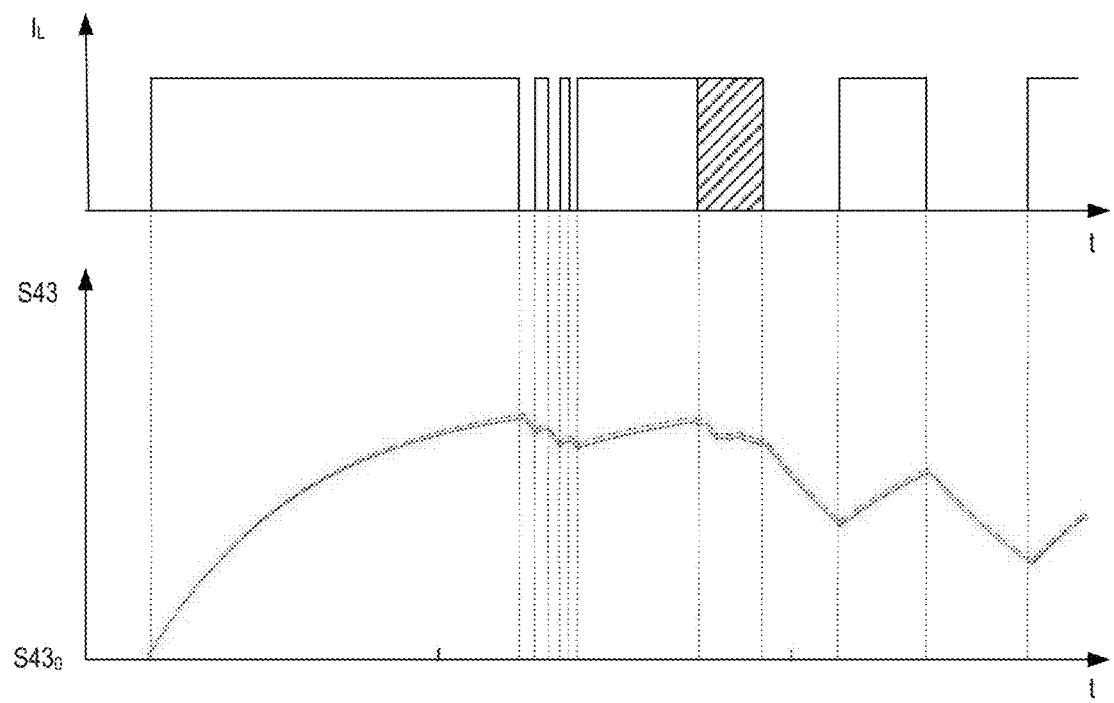
FIG. 15 shows timing diagrams that illustrate one way of operation of the filter.

One way of operation of the filter 43 is shown in FIG. 15. FIG. 15 shows timing diagrams of the load current $I_L$ and the filter output signal S43. By virtue of the integrating characteristic of the filter 43, the filter output signal S43 follows the load current $I_L$. When the load current $I_L$ is constant over a certain time period, the filter output signal S43 approaches a signal level associated with the respective level of the load current $I_L$. In the example shown in FIG. 15, variations of the signal level of the filter output signal S43 result from variations of the load current $I_L$ over the time period illustrated in FIG. 15. The hatched region in the timing diagram shown in FIG. 15 represents a time period where the electronic switch 2 switches on and off frequently. In this time period, the filter output signal S43 is substantially constant. FIG. 15 shows a normal operation mode of the electronic circuit and the load Z connected thereto. In this example, the load current has a predefined current level when the electronic switch 2 is switched on and is zero when the electronic switch 2 is switched off. The temperature of the wire which is represented by the filter output signal varies dependent on the load current $I_L$, in particular dependent on a current-time characteristic of the load current, that is, dependent on the current level and how long a certain level prevails. When the electronic switch 2 is switched off long enough for the wire to dissipate the thermal energy introduced by the load current $I_L$ the temperature of the wire equals the ambient temperature of the wire. It should be noted that the ambient temperature is not considered in the filter output signal S43. The filter output signal S43 only represents temperature changes in the wire caused by introducing energy through the load current $I_L$ and dissipating energy by heat radiation.

The timing diagrams shown in FIG. 15 represent a scenario in which the electronic switch 2 was switched off long enough for the filter output signal S43 to decrease to a start value $S43_0$, or in which the load current $I_L$ was below a current level represented by the lowest reference voltage ($VREF_1$ in FIG. 9, for example) of the ADC 43 long enough for the filter output signal S43 to stay on the start value or decrease to the start value S430. The start value, for example, is zero. When the electronic switch 2 switches on the filter output signal increases and, if the current prevails long enough, approximates a signal level defined by the current level. The rate at which the filter output signal S43 increases and the signal level it approximates after a certain time is dependent on the current level of the load current $I_L$.

Figure 16:
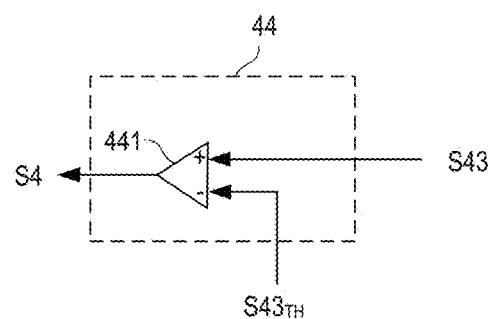
FIG. 16 shows one example of a comparator circuit included in the first protection circuit shown in FIG. 8.

FIG. 16 shows one example of the comparator circuit 44. In this example, the comparator circuit 44 includes a (digital) comparator 441 that receives the filter output signal S43 and a threshold signal $S43_{TH}$. Referring to the above, the filter output signal S43 represents temperature changes that result from the load current $I_L$ and from heat being dissipated. An ambient temperature of the wire is not considered in the filter output signal S43. The absolute temperature of the wire is given by the ambient temperature plus the temperature difference represented by the filter output signal S43. The threshold signal $S43_{TH}$ represents a maximum temperature difference that is allowed to occur in the cable as a result of the load current $I_L$. If the filter output signal S43 reaches the temperature threshold $S43_{TH}$, the comparator circuit 4 generates a protection level (disable level) of the first protection signal S4 in order to switch off the electronic switch. According to one example, the threshold signal $S43_{TH}$ represents a difference between a maximum temperature the wire can withstand and the maximum ambient temperature that might occur in the ambient of the wire in a normal operation scenario. In this example, the wire may reach the maximum temperature only if the ambient temperature is at its maximum. If the ambient temperature is below the maximum, the absolute temperature of the wire is below the maximum temperature when the filter output signal S43 reaches the threshold $S43_{TH}$ and the comparator circuit 44 switches off the electronic switch 2. In the example shown in FIG. 16, the comparator 441 receives the filter output signal S43 at a non-inverting input and the threshold signal $S43_{TH}$ at an inverting input. The first protection signal S4 is available at an output of the comparator 441.

Referring to the above, the filter output signal S43[k] represents a weighted sum of the filter temperature $T_W[k]$, whereas the weighting factor β includes wire parameters, such as $R_{EL}$, $R_{TH}$ and α. Thus, according to one example, the threshold signal $S43_{TH}$ is also dependent on these wire parameters, so that $S43_{TH}$ can be different for different types of wires.

Figure 17:
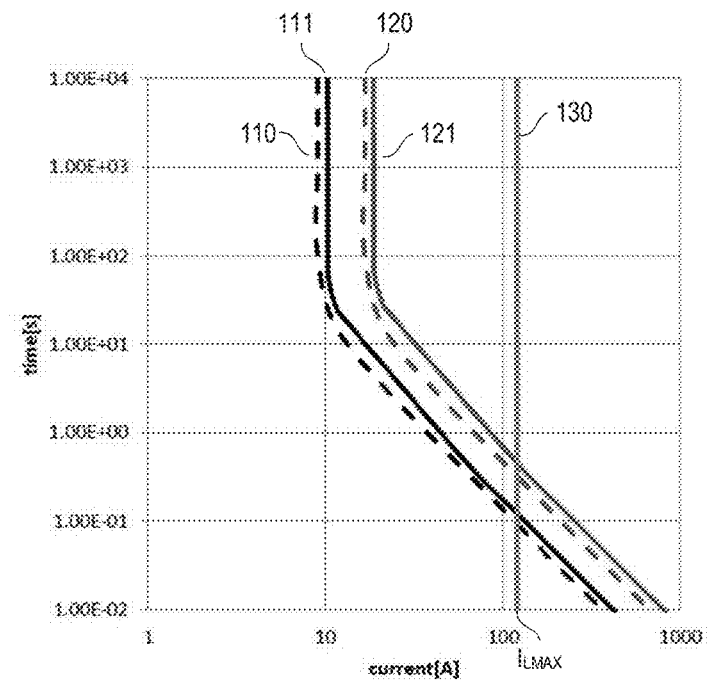
FIG. 17 illustrates the characteristic curve of an electronic circuit that includes a first protection circuit (wire protection circuit) and, optionally, a second protection circuit (overcurrent protection circuit)

FIG. 17 shows two examples that illustrate the protective function provided by the first protection circuit 4. FIG. 17 shows characteristic curves of wires with different cross sections. In particular, FIG. 17 shows $I^2t$ curves of the individual wires. Each of these curves represents a plurality of currents and times associated with the individual currents. The time associated with one current is the time the wire can withstand the respective current without being damaged or destroyed. The individual curves are based on the formula $I_L^2 \cdot t = c$, where c is a constant which is dependent on the cross sectional area of the respective wire and the temperature change the wire can withstand. Basically, the time a wire can withstand a certain current increases as the cross sectional area increases. In FIG. 17, the curve labelled with 111 represents the characteristic curve of a first wire with a first cross sectional area and the curve labelled with 121 represents the characteristic curve of a second wire with a second cross sectional area larger than the first cross sectional area. Curve 110, drawn in a dashed line, illustrates the trip curve of a first protection circuit 4 adapted to the first wire, and curve 120, drawn in a dashed line, illustrates the trip curve of a first protection circuit 4 adapted to the second wire. Referring to the above, the first protection circuit 4 can be adapted to protect a specific wire by adapting a in the filter 43 and $S43_{TH}$ in the comparator circuit 44. The "trip curve" represents a plurality of currents and times associated with the individual currents, whereas the time associated with a current is the time the first protection circuit 4 allows the respective current to flow before switching off the electronic switch 2 via the drive circuit 3.

As can be seen from FIG. 17, the first protection circuit 4 protects the respective wire. That is, the first protection circuit 4 switches off the first electronic switch 2 in each case before a certain current flows long enough to reach the time period associated with this current by the characteristic curve of the wire.

In FIG. 17, curve 130 represents the trip curve of the overcurrent protection circuit 53. The overcurrent protection circuit 53 switches off the first electronic switch in each case when the load current reaches a maximum current level $I_{LMAX}$. When the first protection circuit 4 and the overcurrent protection circuit 53 are active, the first protection circuit 4 can switch off the electronic switch 2 at currents lower than the maximum current level $I_{LMAX}$ if these currents flow longer than allowed (that is, longer than defined by the respective trip curve), and the overcurrent protection circuit 53 prevents the load current $I_L$ from rising above the maximum current level $I_{LMAX}$.

Referring to the above, the ADC 42 samples the input signal V42 that represents the current measurement signal CS at sampling times governed by the clock signal CLK. The ADC output signal S42 is a good representation of the current measurement signal CS and, therefore, the load current $I_L$ if a frequency of the load current $I_L$ is less than half the sampling frequency. This is in accordance with the Nyquist theorem. If, however, a frequency of the load current $I_L$ is more than half of the sampling frequency, situations may occur where the ADC output signal S42 does not correctly represent the load current $I_L$. This is explained with reference to FIG. 18.

Figure 18:
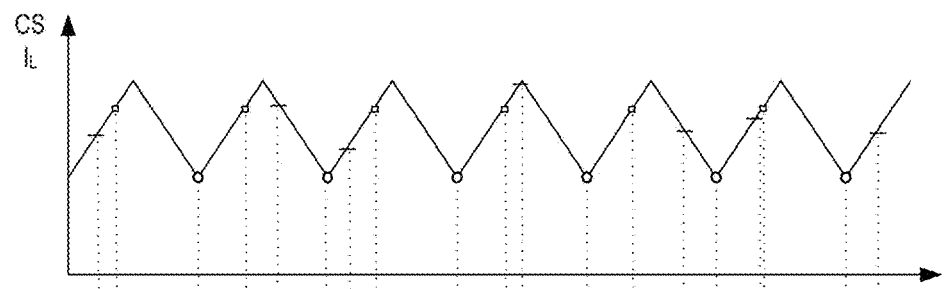
FIG. 18 illustrates sampling a current measurement signal in accordance with the clock signal, according to one example.

FIG. 18 shows a timing diagram of the load current $I_L$ according to one example. In this example, the load current $I_L$ is a periodic signal with a frequency that equals the sampling frequency. Furthermore, FIG. 18 shows a timing diagram of the clock signal CLK that governs sampling of the current measurement signal CS in the ADC 42. Just for the purpose of explanation, it is assumed that the current measurement signal CS is sampled by the ADC 42 each time signal pulses of the clock signal CLK have a rising edge. Sample values obtained by this are illustrated by circle symbols in FIG. 18. In the present example, a phase shift between the oscillating load current $I_L$ and the clock signal CLK is such that the load current $I_L$ is sampled when the load current $I_L$ has a local minimum. In this case, a load current represented by the ADC output signal S42 is smaller than an average load current through the cable. If the phase shift of the clock signal CLK relative to the load current $I_L$, for example, is such that the current measurement signal CS is sampled each time the signal level is close to a local maximum, the load current $I_L$ represented by the ADC output signal S42 is higher than the average load current. In FIG. 18, this is illustrated by the signal pulses drawn in dashed lines and the sample values illustrated by square symbols. This problem can be avoided by increasing the sampling frequency. Increasing the sampling frequency, however, requires processing more sample values in a predefined time period.

Figure 19:
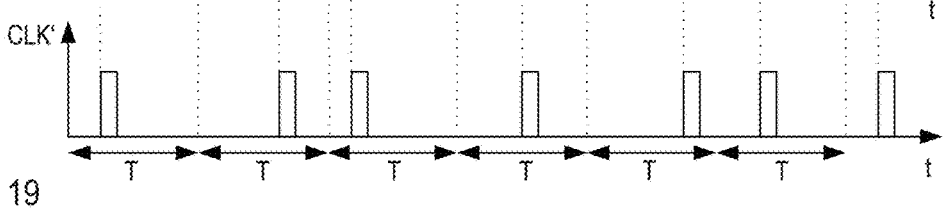
FIG. 19 shows a timing diagram of a clock signal that includes a plurality of clock cycles and clock pulses with varying positions in the individual clock cycles.

One approach that does not increase the number of samples to be processed in a predefined time period, but resolves the problem outlined above is shown in FIG. 19. In this example, there is a sequence of temporally successive sampling periods which may have the same length. The current measurement signal CS (represented by the ADC input signal V42) is sampled once in each of these sampling periods. However, sampling times within the individual sampling periods are randomly or pseudo-randomly selected. In FIG. 19 this is illustrated by signal pulses of a clock signal CLK' having different time positions within the individual sampling periods. In this example, the individual sampling periods each have a duration T. The "time position" of a signal pulse (clock pulse) is a time position relative to a beginning or an end of the respective sampling period. Each of these sampling periods is represented by its duration T in FIG. 19. By randomly or pseudo-randomly selecting the sampling times within the individual sampling periods T, different sample values of the current measurement signal CS are obtained, even if the current measurement signal CS has a frequency that equals the frequency at which the individual sampling periods begin. The sample values obtained by using a clock signal CLK' as shown in FIG. 19 are illustrated by horizontal lines in FIG. 18. As can be seen, these sample values are obtained at different positions of one period of the current measurement signal CS, so that those sample values provide a better representation of the current measurement signal CS.

Figure 20:
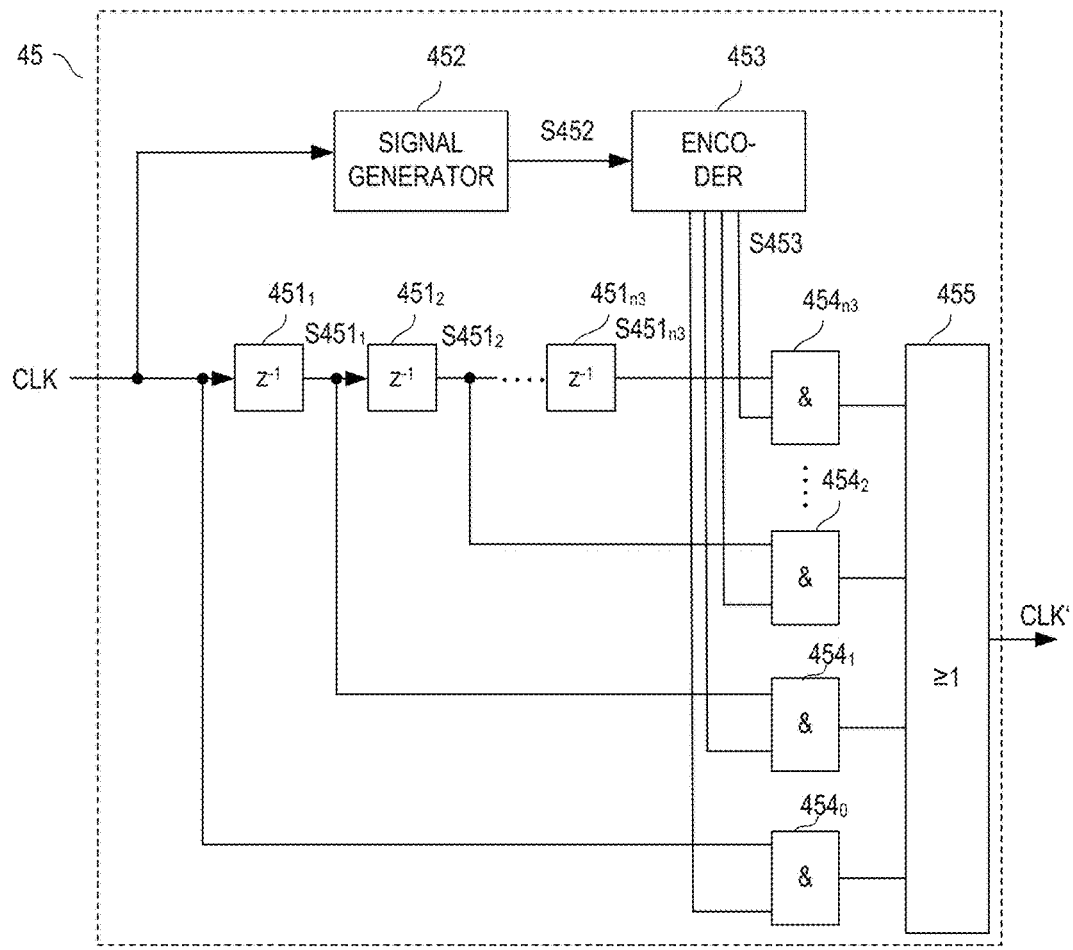
FIG. 20 shows one example of a circuit configured to generate a clock signal as shown in FIG. 19 from a clock signal as shown in FIG. 18.

According to one example, a modified clock signal CLK' of the type shown in FIG. 19 is obtained from a periodic clock signal CLK shown in FIG. 18 by subdividing each sampling period T into n3 sub-periods, wherein a duration of each of these sub-periods is given by T/n3. In each sampling period T, one of these sub-periods is randomly or pseudo-randomly selected and a signal pulse is generated in the respective sub-period. FIG. 20 shows a circuit 45 configured to generate the clock signal CLK' in this way.

This circuit 45, for example, is included in the first protection circuit 4 and receives the clock signal CLK and provides the modified clock signal to the ADC 42. In this case, the sampling and encoding circuit 422 shown in FIG. 9 receives the modified clock signal CLK' instead of the clock signal CLK. The filter 43 may still be operated based on the clock signal CLK.

Figure 21:
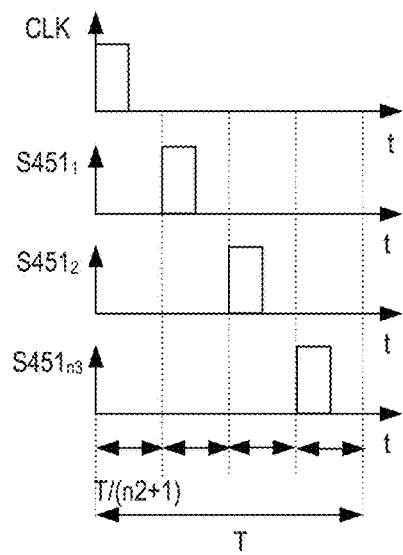
FIG. 21 shows timing diagrams that illustrate one way of operation of the circuit shown in FIG. 20.

Referring to FIG. 20, the circuit 45 includes a series (chain) of delay elements $451_1$-$451_{n3}$ which operate at n3 times the frequency of the clock signal CLK. These delay elements are connected in series. Operating the delay elements $451_1$-$451_{n3}$ at n3 times the frequency of the clock signal CLK means that a signal pulse of the clock signal CLK received by a first one $451_1$ of the delay elements "travels" through the series of delay elements at n3 times the frequency of the clock signal CLK. That is, the signal pulse is output by the first delay element $451_1$ at T/n3 after it was input into the chain of delay elements, is output by a second one $451_2$ of the delay elements at 2T/n3 after it was received at the input, and so on. This is illustrated in FIG. 21 where timing diagrams of the clock signal CLK and output signals of the individual delay elements are illustrated in one period T of the clock signal.

The circuit 45 further includes a plurality of logic gates $454_0$-$454_{n3}$ which are, for example, AND gates. One $454_0$ of these logic gates receives the clock signal CLK and each of the other ones $454_1$-$454_{n3}$ of these logic gates receives the output signal $S451_1$-$S451_{n3}$ of a respective delay element $451_1$-$451_{n3}$ and one bit of a selection signal S453. The selection signal S453 is generated by an encoder based on a random or pseudo random signal S452 generated by a signal generator 452. The random or pseudo random signal S452, for example, includes a sequence of binary words, wherein one binary word is output in each sampling period and defines the sub-period in which the signal pulse is to be generated. If, for example, one sampling period is subdivided into 8 (=n3+1) sub periods, the binary words of the signal S452 can have 3 bits. In general, if one sampling period is subdivided into n3+1 sub-periods, the binary words output by the signal generator 452 have at least $\log_2(n3+1)$ bits.

The encoder 453, based on each binary word received from the signal generator 452, generates a respective binary word with n3+1 bits of the selection signal S453. Each of these n3+1 bits is received by a respective logic gate $454_0$-$454_{n3}$. This binary word in each clock cycle selects either the clock signal CLK or one of the output signals $451_1$-$451_{n3}$ of the delay elements $451_1$-$451_{n3}$ to be the modified clock signal CLK', wherein the selection may change from clock cycle to cycle. According to one example, the encoder 453 generates the binary word such that only one of these bits is "1" and the other bits are "0". The output signal received by the AND gate that receives the "1" in one clock cycle is the modified clock signal CLK' in this clock cycle. The modified clock signal CLK' is output by another logic gate 455 that is coupled to outputs of the logic gates $454_0$-$454_{n3}$. The other logic gate 455 is an OR gate, for example.

According to one example, the signal generator 452 is a pseudo-random signal generator and includes a linear feedback shift register (LFSR). According to one example, the signal generator receives the clock signal CLK and generates a new pseudo-random binary word in each clock cycle. Output values of an LFSR are not random. In particular, there can be a correlation between several successive output values. According to one example, in order to avoid a correlation between successive output values received by the encoder 453, the LFSR receives a clock signal with a frequency higher than the frequency of the clock signal CLK and only every m-th output value of the LFSR is used to generate the selection signal S453. According to one example, m is 5, 7 or higher than 7. Alternatively, the encoder uses only m-th output value received from the signal generator 452 to generate the modified clock signal CLK'.

According to one example, the control circuit 1 and, therefore, the electronic circuit can operate in at least two different operation modes. According to one example, the at least two different operation modes include a first operation mode and a second operation mode. According to one example, a set of functions performed by the control circuit 1 in the second operation mode is reduced as compared to a set of functions performed by the control circuit 1 in the first operation mode. According to one example, the control circuit 1 is configured to perform a set of basic functions in the second operation mode, and is configured to perform the set of basic functions and at least one additional function in the first operation mode. Thus, power consumption of the control circuit 1 in the second operation mode is lower than in the first operation mode.

According to one example, the set of basic functions of the control circuit 1 includes driving the electronic switch 2 based on the input signal $S_{IN}$, monitoring the load current $I_L$ and at least one of generating the overtemperature protection signal S52 and generating the overcurrent protection signal S53. According to one example, the at least one additional function includes generating the first protection signal (wire protection signal) S4. In the following, the first operation mode is also referred to as wire protection mode, and the second operation mode is also referred to as idle mode.

Figure 22:
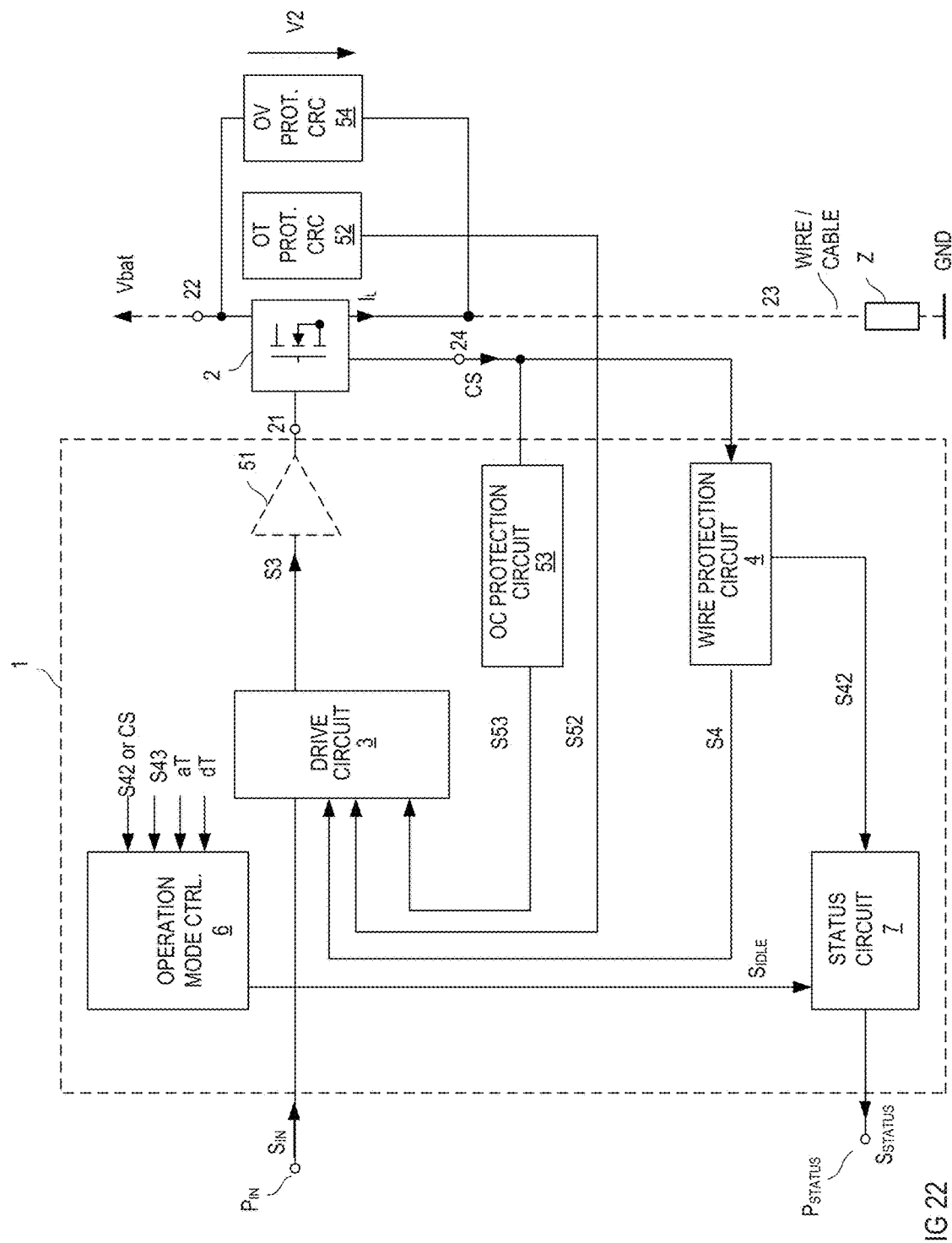
FIG. 22 shows a control circuit according to another example.

FIG. 22 shows one example of the control circuit 1 that is configured to operate in one of at least two different operation modes. In this example, the control circuit 1 includes an operation mode controller 6 that is configured to select the respective operation mode. According to one example, the control circuit 1 enters the second operation mode at least dependent on the load current $I_L$, in particular, when the load current $I_L$ falls below a predefined current threshold. This current threshold is referred to as idle mode threshold in the following. According to one example, the operation mode controller 6 uses additional criteria to enter the second operation mode. These criteria include, for example, the output signal S43 of the filter 43 (not shown in FIG. 22) included in the first protection circuit 4, a temperature difference between a temperature in the electronic switch 2 and a temperature in the control circuit 1, and an ambient temperature. A signal representing the temperature difference is referred to as dT in FIG. 22, and a signal representing the ambient temperature is referred to as aT in FIG. 22. According to one example, the control circuit enters the second operation mode only if at least one of the following criteria is met: (a) the filter output signal S43 is zero; (b) a temperature difference dT between the temperature in the electronic switch 2 and the temperature in the control circuit 1 is below a predefined temperature threshold; (c) the ambient temperature is below a predefined temperature threshold; (d) an on-resistance of the electronic switch 2 is higher than a predefined resistance threshold. According to one example, the temperature difference dT is measured using the temperature sensor in the overtemperature detection circuit 52 and another temperature sensor (not shown in the drawings) in the control circuit 1. According to one example, the ambient temperature is measured by the temperature sensor in the control circuit 1 or by the temperature sensor in the overtemperature protection circuit. The on-resistance of the electronic circuit 2 is the electric resistance of the electronic switch in the on-state. The on-resistance is given by the load path voltage V2 of the electronic switch 2 in the on-state divided through the load current, $R_{ON}=V2/I_L$. According to one example, the control circuit 1 is configured to calculate the on-resistance $R_{ON}$ based on the load path voltage V2 measured by the overvoltage protection circuit and the current sense signal CS. If the on-resistance $R_{ON}$ is below the predefined resistance threshold this may indicate that the electronic switch 2 is damaged so that the control circuit 1 does not enter the idle mode.

The operation mode controller 6 may receive the current measurement signal CS or the output signal S42 from the ADC 42 (see FIG. 8) in the first protection circuit 4 to monitor the load current $I_L$ and operate the control circuit 1 in one of the first and second operation mode based on this signal S42 or CS. According to one example, the operation mode controller 6 generates a status signal $S_{IDLE}$ that indicates whether the control circuit 1 is in the idle mode or the wire protection mode. This status signal is also referred to as internal status signal in the following. A status circuit 7 is configured to receive the internal status signal $S_{IDLE}$ and output a status signal $S_{STATUS}$ at an output pin $P_{STATUS}$ of the control circuit 1. Besides the internal status signal $S_{IDLE}$ the status circuit 7 receives the ADC output signal S42 from the ADC 42 (not shown in FIG. 22) in the first protection circuit (wire protection circuit) 4. The ADC 42 can be a linear ADC or a logarithmic ADC.

Figure 23:
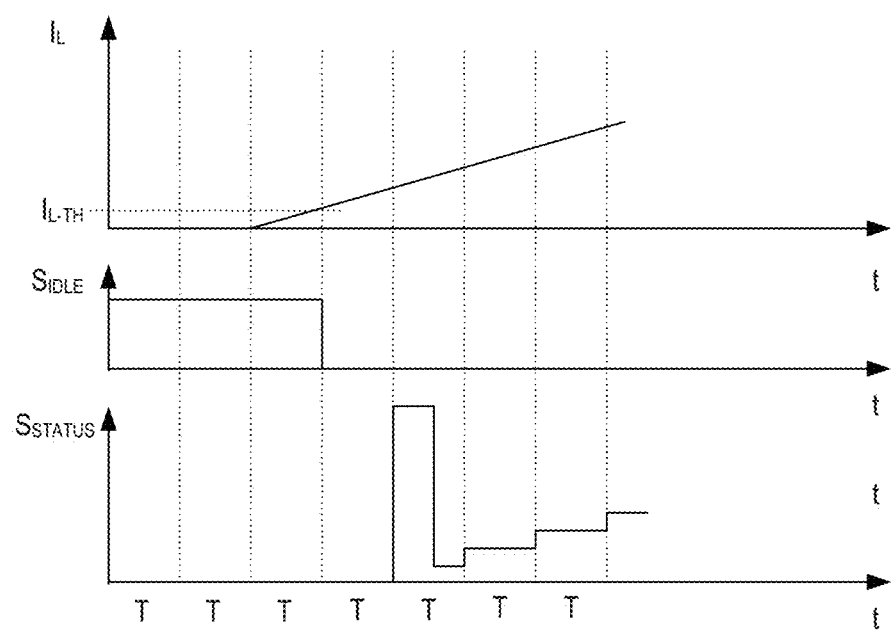
FIG. 23 shows timing diagrams that illustrate one way of operation of the control circuit shown in FIG. 22.

According to one example, the status circuit 7 is configured to generate the status signal $S_{STATUS}$ such that the status signal $S_{STATUS}$ has a wake up pulse when the operation mode changes from the second mode to the first mode and, after the wake up pulse, is based on the ADC output signal S42. This is illustrated in FIG. 23 which shows timing diagrams of the load current $I_L$, the internal status signal $S_{IDLE}$ and the external status signal $S_{STATUS}$. According to one example, the operation mode changes from the second operation mode to the first operation mode when the load current $I_L$ rises above a predefined current threshold $I_{L\text{-}TH}$. According to one example (shown in FIG. 23) the status circuit operates in clocked fashion, as illustrated by the clock cycles T in FIG. 23. In this example, the status circuit 7 generates the wake up pulse in the clock cycle that follows the clock cycle in which the load current crosses the threshold $I_{L\text{-}TH}$. Furthermore, the internal status signal $S_{IDLE}$ changes from a signal level indicating that the control circuit 1 is in the idle mode to a signal level indicating that the control circuit 1 is in the wire protection mode at the beginning of the next clock cycle after the load current $I_L$ has crossed the threshold $I_{L\text{-}TH}$. Just for the purpose of explanation, the idle mode is represented by a high signal level and the wire protection mode is represented by a low signal level of the internal status signal $S_{IDLE}$ in the example shown in FIG. 23.

When the internal status signal $S_{IDLE}$ indicates that the operation mode has changed to the wire protection mode, the status signal 7 generates a wake up pulse. According to one example, this wake up pulse is used to "wake up" a microcontroller which, for example, generates the input signal $S_{IN}$ of the control circuit 1. After the wake up pulse, the status circuit 7 passes through the ADC output signal S42 to the status output $P_{STATUS}$. Using the ADC output signal S42 the microcontroller, for example, may perform an external protective function. An "external protective function" is a protective function performed by an external circuit, such as a microprocessor. Based on this external protective function, the microcontroller may switch off the electronic switch 2 by generating an off-level of the input signal $S_{IN}$. According to one example, the wake up pulse has a signal level suitable to be detected by the microprocessor in the sleep mode.

Figure 24:
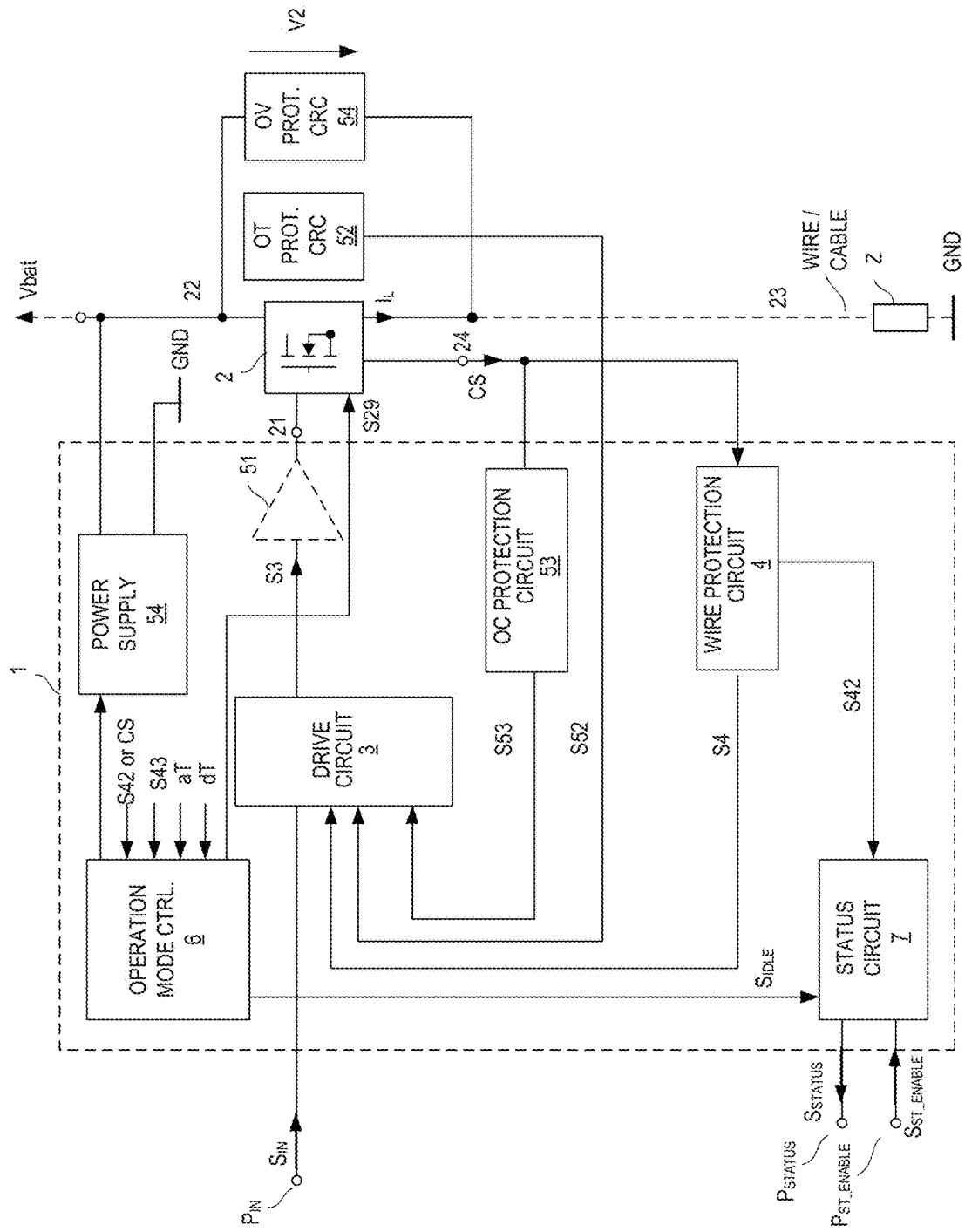
FIG. 24 shows a control circuit according to another example.
Figure 25:
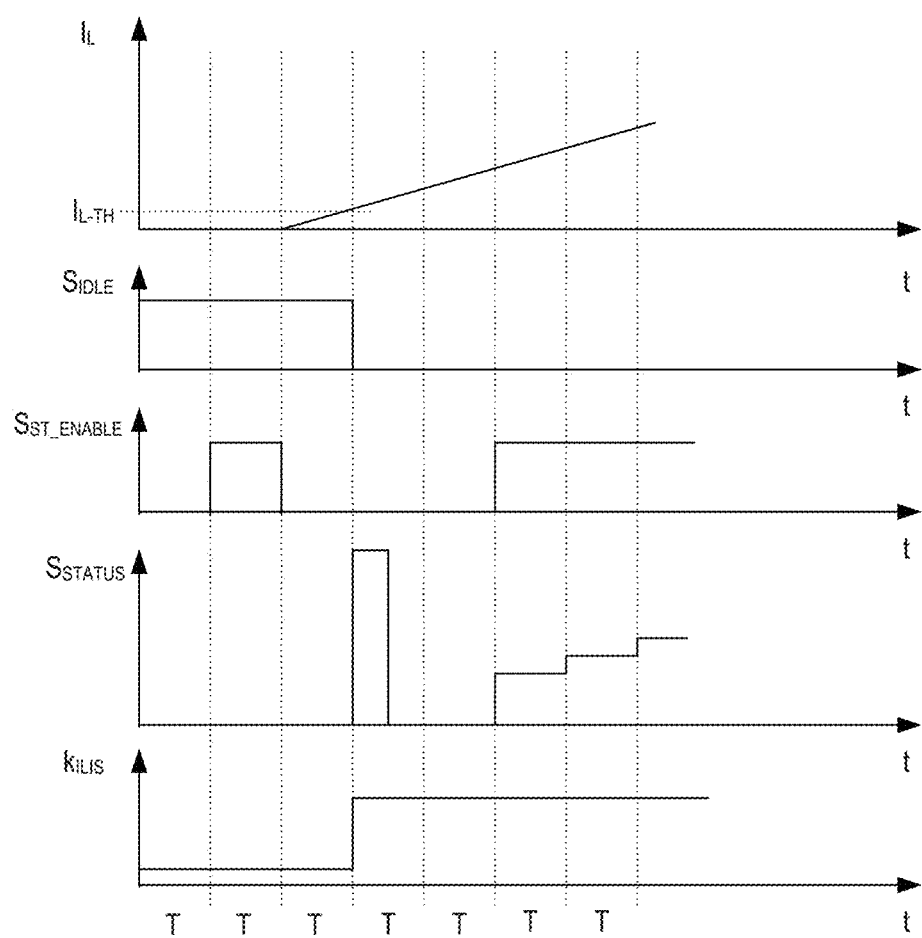
FIG. 25 shows timing diagrams that illustrate one way of operation of the control circuit shown in FIG. 24.

FIG. 24 shows a modification of the control circuit 1 shown in FIG. 22. In this control circuit 1, the status circuit 7 is configured to receive an enable signal $S_{ST\_ENABLE}$ via another input node $P_{ST\_ENABLE}$. This enable signal $S_{ST\_ENABLE}$ is generated, for example, by the external circuit (not shown) that receives the status signal $S_{STATUS}$. In this example, the status circuit 7 is configured to output a status information via the status signal $S_{STATUS}$ in the idle mode and the wire protection mode only upon request by the enable signal $S_{ST\_ENABLE}$. This is illustrated in FIG. 25 where timing diagrams of the load current $I_L$, the external status signal $S_{STATUS}$, the internal status signal $S_{IDLE}$, and the enable signal $S_{ST\_ENABLE}$ are shown. Referring to FIG. 25, the enable signal $S_{ST\_ENABLE}$ can have two signal levels, a first level that enables the status circuit 7 to output a status information, and a second level that disables a status circuit 7 to output the status information. Just for the purpose of illustration, the level that enables the status circuit 7 is a high level and the level that disables the status circuit 7 is a low level in the example shown in FIG. 25. Referring to FIG. 25, if enabled by the enable signal $S_{ST\_ENABLE}$ in the idle mode, the status circuit 7 outputs a signal pulse indicating that the control circuit 1 is in the idle mode. This signal pulse is different from the wake up pulse. According to one example a level of the signal pulse indicating the idle mode is lower than a level of the wake up pulse. If enabled by the enable signal $S_{ST\_ENABLE}$ in the wire protection mode, the status circuit 7 outputs the ADC output signal S42 as the status information. Independent of the signal level of the status signal $S_{ST\_ENABLE}$, the status circuit 7 outputs the wake up pulse when the control circuit 1 changes from the idle mode to the wire protection mode. This change is represented by the internal status signal $S_{IDLE}$ changing its signal level.

According to one example, the proportionality factor $k_{ILIS}$ is different in the idle mode and the wire protection mode. According to one example, $k_{ILIS}$ is smaller in the idle mode than the wire protection mode, so that at a given signal level of the load current $I_L$, the sense current $I_S$ (which can be equal the current measurement signal CS) and, therefore, the ADC output signal is higher in the idle mode than the wire protection mode. Thus, the smaller currents occurring in the idle mode can be more precisely measured. Varying the proportionality factor dependent on the operation mode is illustrated in FIG. 24 by the operation mode controller 6 outputting the control signal S29 that, referring to FIG. 7, adjusts the proportionality factor $k_{ILIS}$. The change of the proportionality factor $k_{ILIS}$ when the control circuit changes from the second operation mode to the first operation mode is schematically illustrated in FIG. 25.

Referring to the above, one or more of the functions that the control circuit 1 has in the wire protection mode can be deactivated in the idle mode in order to reduce the power consumption of the control circuit 1 in the idle mode as compared to the wire protection mode. Referring to FIG. 24, the control circuit 1 can include a power supply circuit 54 that is connected between the supply nodes for the positive supply potential $V_{BAT}$ and ground potential GND. This power supply circuit 54 is configured to generate supply voltages to the individual functional blocks of the control circuit 1 based on the supply voltage available between the supply nodes. According to one example, the operation mode controller 6, by controlling the power supply circuit 54, is configured to keep activated some of the functional blocks in the idle mode.

Figure 26:
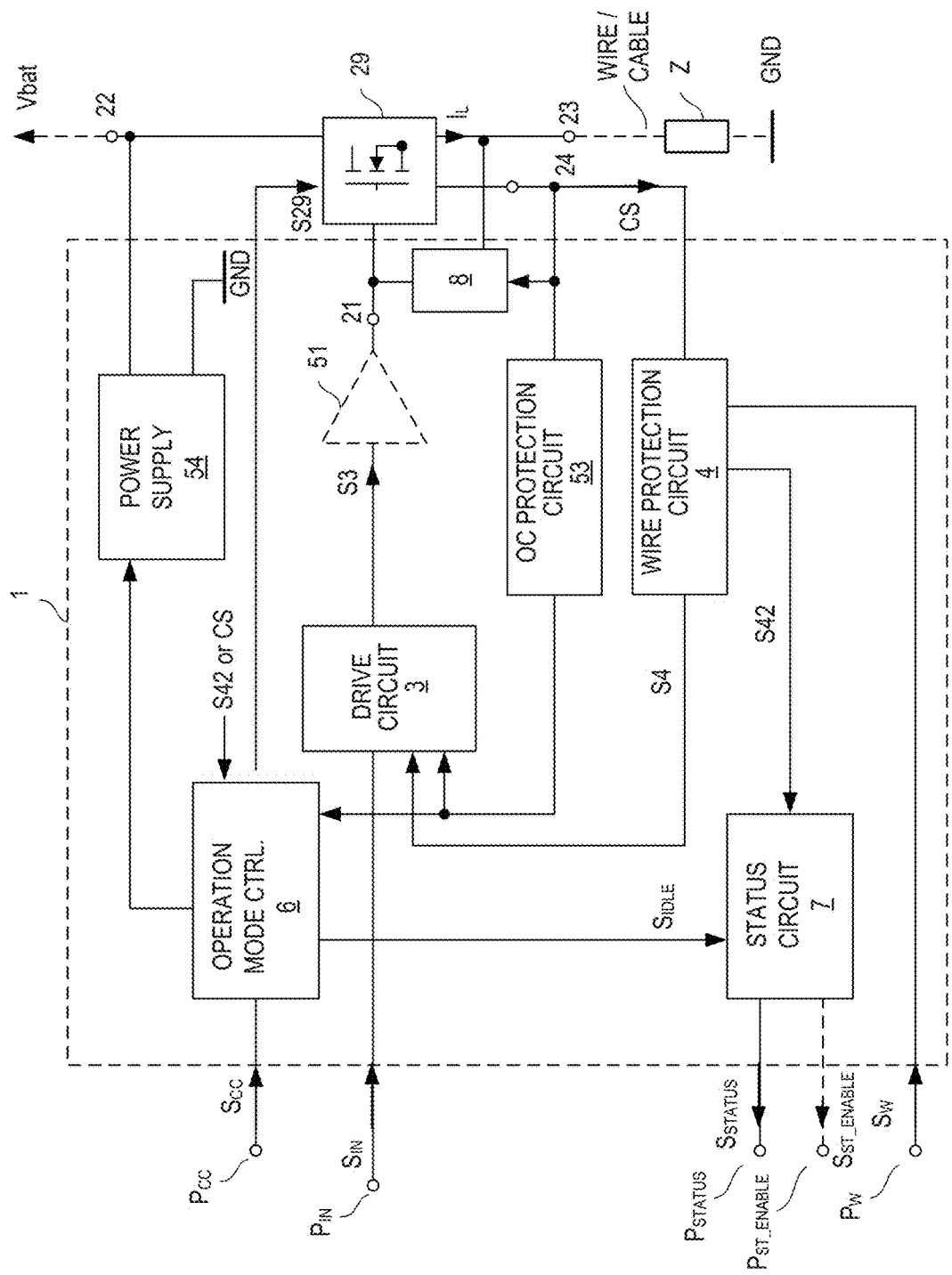
FIG. 26 shows a control circuit according to another example.

According to one example, the control circuit 1, besides the first operation mode (wire protection mode) and the second operation mode (idle mode), can operate in further operation modes. Some of these further operation modes are explained with reference to FIG. 26 below. FIG. 26 shows a modification of the control circuit 1 shown in FIG. 22, the status enable input $P_{ST\_ENABLE}$ is optional and, therefore, illustrated in dashed lines in FIG. 26. The control circuit 1 shown in FIG. 26 includes a further input $P_{CC}$ which is referred to as capacitive charging input in the following. This input $P_{CC}$ is coupled to the operation mode controller 6 and serves to operate the control circuit 1 in a third operation mode, which is referred to as capacitive charging mode in the following. In the idle mode or the wire protection mode explained before, the overcurrent protection circuit 53 switches off the electronic switch 2 when the load current $I_L$ reaches a predefined overcurrent threshold. When, for example, the load Z is a capacitive load that has been discharged before the electronic switch 2 switches on, a high inrush current can flow when the electronic switch 2 switches on, so that the load current $I_L$ may reach the overcurrent threshold before the capacitive load has been charged and the load current $I_L$ again decreases. Such operation of the control circuit 1 in the idle mode or the wire protection mode is illustrated in FIG. 27A.

Figure 27A:
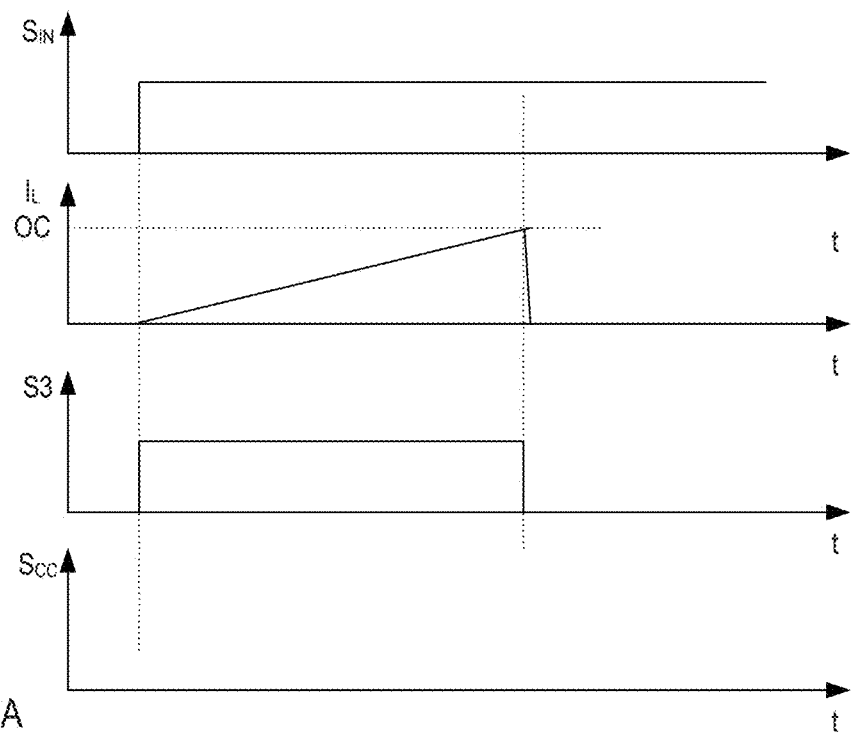
FIGS. 27A and 27B show timing diagrams that illustrate operation of the control circuit shown in FIG. 26 in different operation modes.

FIG. 27A shows timing diagrams of the input signal $S_{IN}$, the load current $I_L$, the drive signal S3, and a capacitive charging signal $S_{CC}$ received at the input $P_{CC}$. In the idle mode or the wire protection mode, the capacitive charging signal $S_{CC}$ has a signal level indicating that the control circuit 1 is not to be operated in the capacitive charging mode. Just for the purpose of explanation, this signal level is a low level in the example shown in FIG. 27A. As can be seen from FIG. 27A, in the wire protection mode or the idle mode, the control circuit 1 switches off the electronic switch 2 when the load current $I_L$ reaches an overcurrent threshold OC.

Figure 27B:
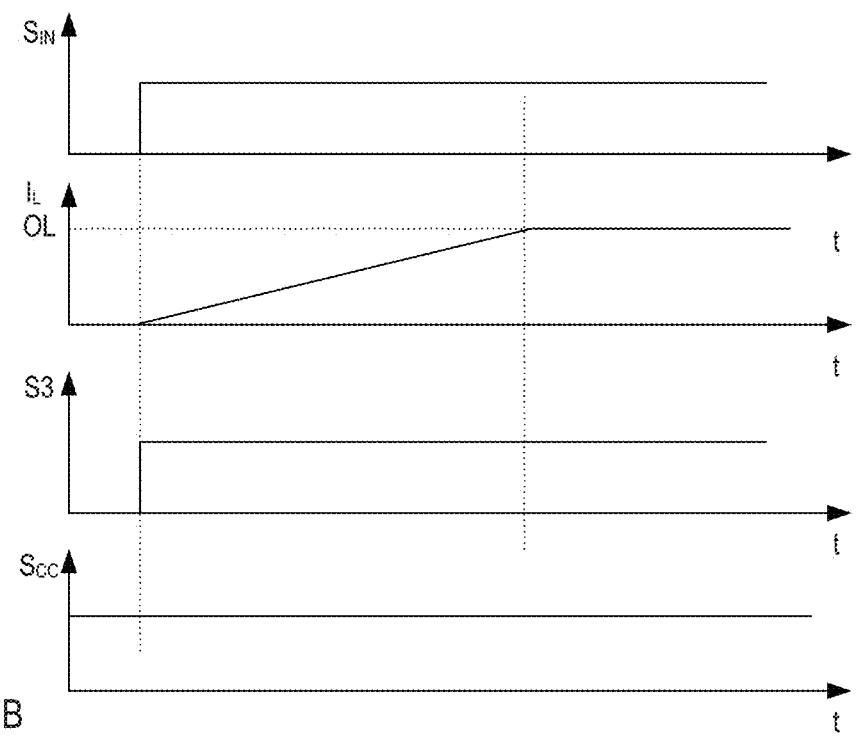

FIG. 27B shows timing diagrams of the same signals shown in FIG. 27A in the capacitive charging mode. In this operation mode, the capacitive charging signal $S_{CC}$ has a signal level indicating that it is desired to operate the control circuit 1 in the capacitive charging mode. Just for the purpose of explanation, this signal level is a high level in the example shown in FIG. 27B. In the capacitive charging mode, the control circuit 1 is configured to regulate the load current $I_L$ to a current threshold OL. This current threshold OL can be the overcurrent threshold OC below.

To control the load current $I_L$, the control circuit 1 may include a regulator 8, shown in FIG. 26. This regulator 8 is connected between the control node 21 and the second load node 23 and is configured to regulate the drive voltage, which is the gate-source voltage in a MOSFET, dependent on the load current $I_L$. To obtain an information on the load current $I_L$ the regulator 8 either receives the current measurement signal CS (as shown) or the output signal S42 of the ADC in the first protection circuit 4. The regulator 8 is configured to regulate the drive voltage such that the load current $I_L$ equals the desired current level in the capacitive charging mode. According to one example, the regulator 8 is activated by the operation controller 6 when the load current $I_L$ has reached the current threshold OL. For this, the operation mode controller 6 receives the current measurement signal or the output signal S42 of the ADC. When the regulator 8 is active it regulates the drive voltage $V_{GS}$ of the electronic switch such that the load current is limited to the current threshold OL.

According to one example, the control circuit 1 is configured to protect different types of wires in the wire protection mode. In this case, the control circuit 1 includes another input $P_W$ which is referred to as wire type input in the following. A signal $S_W$ received at the wire type input $P_W$ adjusts the first protection circuit 4 to the respective type of wire represented by the signal $S_W$. In particular, the signal $S_W$ may adjust the parameter a in the filter 43 and/or the threshold signal $S43_{TH}$ in the comparator circuit 44 in the way explained above.

According to one example, the control circuit 1 is configured to monitor the load current $I_L$ when the load current is below the idle mode threshold. "To monitor" may include to compare the load current $I_L$ with a leakage current threshold that is below the idle mode threshold and different from zero. Comparing the load current with a leakage current threshold may include comparing the current sense signal CS with a respective threshold. According to one example, the control circuit 1 is configured to output a signal indicating that there is an excessive leakage current when a load current $I_L$ higher than the leakage current threshold has been detected for longer than a predefined time period. According to one example, this signal is output via the status output $P_{STATUS}$. According to one example, the threshold that is compared with the current sense signal CS to generate the excessive leakage current signal is adjustable. According to another example, this threshold is fixed, but the control circuit 1 is configured to adjust the $k_{ILIS}$ factor so that current level of the leakage current that triggers generation of the excessive leakage current signal can be adjusted via the $k_{ILIS}$ factor.

Figure 28:
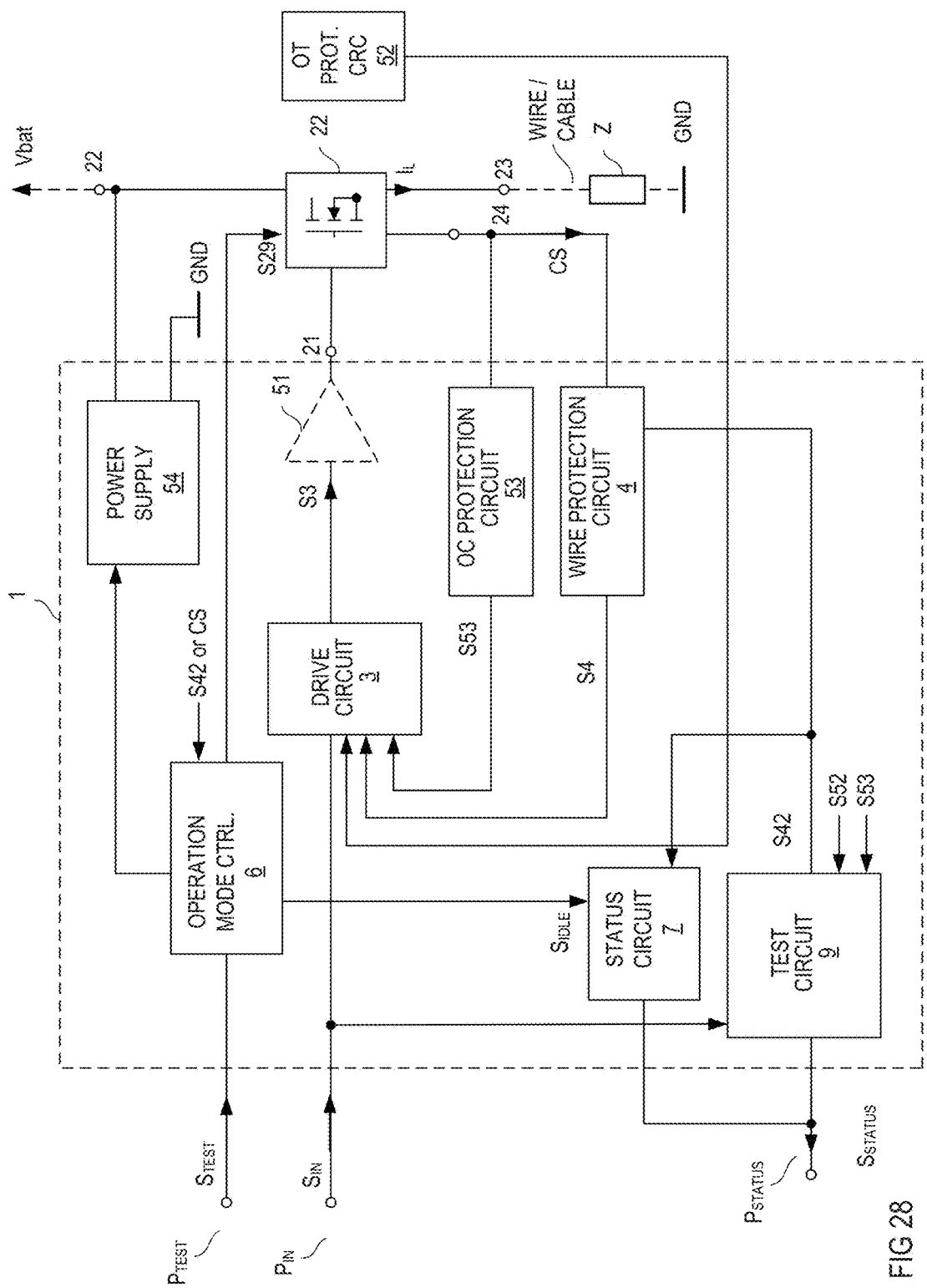
FIG. 28 shows a control circuit according to another example.

FIG. 28 shows a control circuit 1 according to another example. Besides the first operation mode (wire protection mode) and the second operation mode (idle mode), the control circuit 1 shown in FIG. 28 can be operated in another operation mode, which is referred to as test mode in the following. For this, the control circuit 1 includes an input pin $P_{TEST}$, which is referred to as test pin in the following. Via the test pin $P_{TEST}$, the control circuit 1 is configured to receive a test signal $S_{TEST}$. The test signal $S_{TEST}$ indicates whether the control circuit 1 is to be operated in the test mode. According to one example, several functions of the control circuit 1 can be tested in the test mode. In this example, the test signal $S_{TEST}$ indicates that it is desired to test the control circuit 1 and which of the functions are to be tested. The control circuit 1 shown in FIG. 28 includes the status output $P_{STATUS}$ explained with reference to FIG. 26 before. Via this status output $P_{STATUS}$ the control circuit 1 can output the current measurement signal CS or the ADC output signal S42 in an operation mode different from the test mode, such as, for example, the wire protection mode. This is explained above with reference to FIG. 26. In the control circuit 1 shown in FIG. 28 not only the status circuit 7 but also a test circuit 9 is coupled to the status output $P_{STATUS}$. The test circuit 9 receives the current measurement signal CS or the ADC output signal S42 (as shown), the input signal $S_{IN}$, and signals from the functional blocks to be tested.

One example of how the control circuit 1 can operate in the test mode is explained with reference to FIGS. 29A-29C. These figures show timing diagrams of the test signal $S_{TEST}$. According to one example, the test signal $S_{TEST}$ either has a constant level, which is a low level in the example shown in FIG. 28, or includes periodically occurring signal pulses. The constant level indicates that it is not desired to operate the control, circuit 1 in the test mode. The signal pulses indicate that it is desired to operate the control circuit in the test mode. According to one example, different functions can be tested in the test mode. In this example, the function to be tested is defined by a frequency at which the pulses occur. According to one example, not only the frequency at which the pulses occur but also their duration varies dependent on the function that is to be tested. According to one example, the duration of the signal pulses is 50% of one cycle period. Those pulses can be considered as pulsewidth modulation (PWM) pulses with a duty cycle of 50%.

Just for the purpose of explanation it is assumed that three different functions can be tested in the test mode. FIGS. 29A-29C show examples of timing diagrams that the test signal $S_{TEST}$ can have in order to signal the function (function block) to be tested to the operation mode controller 6. For example, these three different functions or function blocks include the overcurrent protection circuit 52 and its function, the overtemperature protection circuit 52 and its function, and a delta temperature function. The delta temperature function compares the temperature difference dT explained above between the electronic switch 2 and the control circuit 1 with a temperature difference threshold. It should be noted that these are only examples of functions that can be tested. The operations mode controller 6 and the test circuit 9 are not restricted to testing only these functions.

Figure 29A:
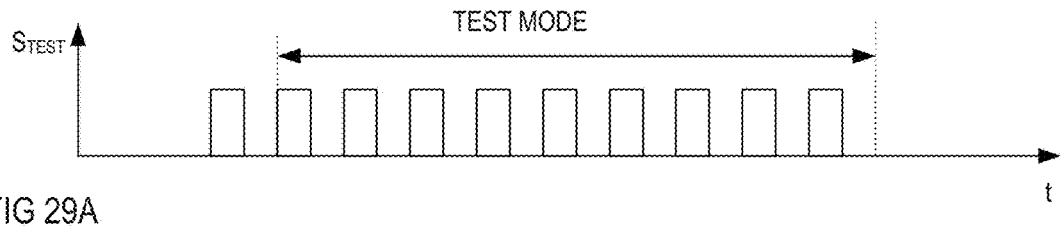
FIGS. 29A-29C show timing diagrams of a test signal configured to initiate a test mode of the control circuit.
Figure 29B:
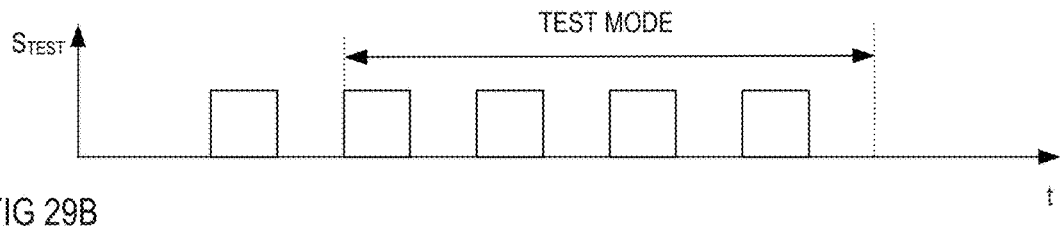
Figure 29C:
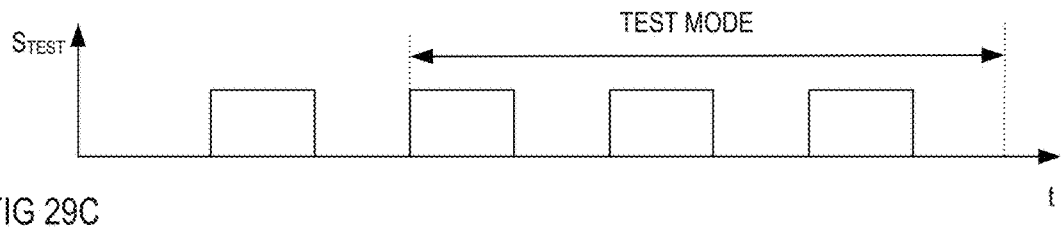
Figure 30:
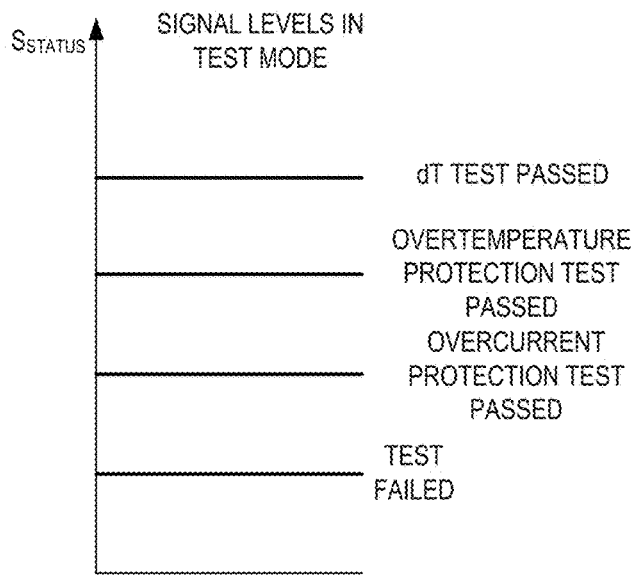
FIG. 30 shows possible signal levels of a signal output by the control circuit in the test mode.

The test signal $S_{TEST}$, for example, includes signal pulses at a first frequency f1, as shown in FIG. 29A, in order to test the overcurrent protection circuit 53 at a second frequency f2, as shown in FIG. 29B, in order to test the overtemperature protection circuit 52, and at a third frequency f3, as shown in FIG. 29C, in order to test the dT function. Just for the purpose of explanation, f1=2f2=3f3 in the example shown in FIGS. 29A-29C. In these figures, besides the timing diagrams of the test signal $S_{TEST}$ the time period in which the control circuit 1 is in the test mode are indicated.

Referring to the above, the overcurrent protection circuit can be tested in the test mode. The overcurrent protection circuit 53 receives the current measurement signal CS and compares the current measurement signal CS with an overcurrent threshold. In order to test the function of the overcurrent protection circuit 53, the operation mode controller 6 is configured, in the test mode, to set the overcurrent threshold to a level that is reached by the load current $I_L$ when a rated current flows through the electronic switch 2. In order to test the overcurrent protection circuit 53, the electronic switch 2 switches on governed by the input signal $S_{IN}$, whereas the overcurrent protection circuit 53 passes the test when the overcurrent protection circuit 53, in the test mode, generates a protection level of the overcurrent protection signal S53.

According to another example, the control circuit 1 is configured, in the test mode, to test the overtemperature protection circuit 52. The overtemperature protection circuit 52 is configured to measure the temperature of the electronic switch 2 and compare the measured temperature with an overtemperature threshold, whereas the over temperature protection circuit 52 generates a protection level of the overtemperature protection signal S52 when the measured temperature is above the overtemperature threshold. To test the overtemperature protection circuit 52, the electronic switch 2 switches on controlled by the input signal $S_{IN}$ and the overtemperature threshold is lowered, so that under normal operation conditions, such as a rated current flowing through the electronic switch 2, the measured temperature reaches the lowered threshold. The overtemperature protection circuit 52 passes the test when the measured temperature reaches the lowered temperature threshold so that the overtemperature protection signal S52 has the protection level during the test mode.

Similarly, to test the temperature difference protection circuit 54, the electronic switch 2 switches on controlled by the input signal $S_{IN}$ and the temperature difference threshold is lowered, so that under normal operation conditions, such as a rated current flowing through the electronic switch 2, the measured temperature difference reaches the lowered threshold. The temperature difference protection circuit 54 passes the test when the measured temperature reaches the lowered temperature threshold so that the temperature difference protection signal S54 has the protection level during the test mode.

The test circuit 9 is configured to vary the signal level of the signal $S_{STATUS}$ at the pin $P_{STATUS}$ dependent on the test result. According to one example, the test circuit 9 outputs a fail level when a test fails, and a pass level when a function has been tested successfully. According to one example, different pass levels are output for the different functions to be tested. For example, a first pass level is output when the over current protection circuit 53 has been successfully tested, a second pass level is output when the overtemperature protection circuit 52 has been successfully tested, and a third pass level is output if the delta temperature function has been successfully tested. Examples of the fail level and the pass levels are illustrated in FIG. 29.

Figure 31:
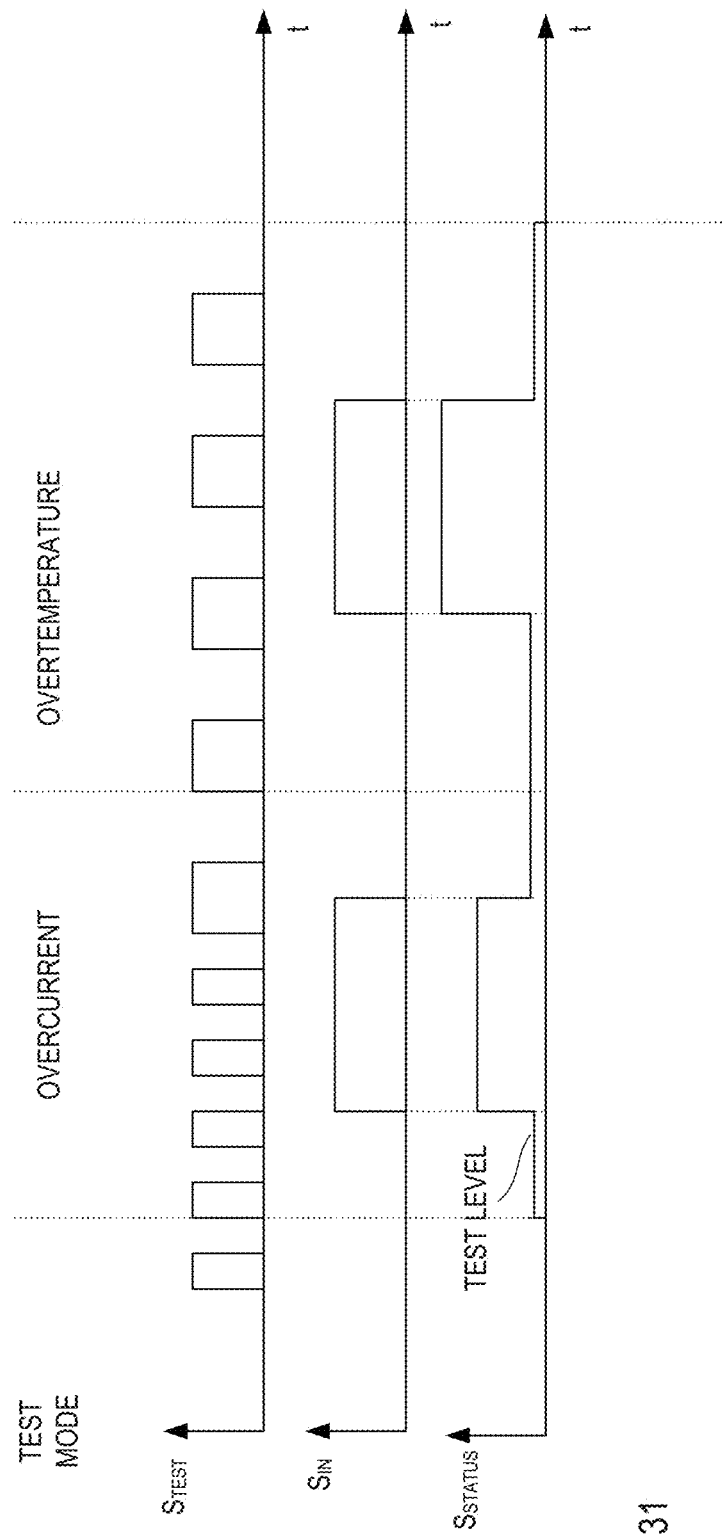
FIG. 31 shows timing diagrams of signals in the test mode.

FIG. 31 shows timing diagrams of signals in test mode. In particular, FIG. 31 shows timing diagrams of the test signal $S_{TEST}$, the input signal $S_{IN}$ and the status signal $S_{STATUS}$. The function that is tested in certain time periods is also indicated in FIG. 31. Just for the purpose of illustration, FIG. 31 shows the timing diagrams in two different test scenarios. A first test scenario, which relates to testing the overcurrent protection function, starts when the operation mode controller based on the test signal $S_{TEST}$ has detected which of the functions is to be tested. According to one example, the operation mode controller is configured to detect the function that is to be tested after one period of the PWM test signal. In the overcurrent test mode the test circuit 9 outputs the first pass level when the input signal $S_{IN}$ has an on-level and when the overcurrent protection circuit 53 passes the test. When the overcurrent protection circuit 53 fails the test, the test circuit 9 outputs the fail level in a time period in which the input signal $S_{IN}$ has the on-level. Equivalently, in the overtemperature test mode the test circuit 9 outputs the second pass level when the input signal $S_{IN}$ has an on-level and when the overtemperature protection circuit 52 passes the test.

According to one example, as shown in FIG. 31, the test circuit 9 outputs a signal level different from zero at the status output $S_{STATUS}$ that indicates that the control circuit 1 is in test mode. This signal level can be referred to as test level. According to one example, the control circuit 1 outputs the test level as soon as the control circuit 1 enters the test mode. This test level is different from the fail level and the pass levels.

Figure 32:
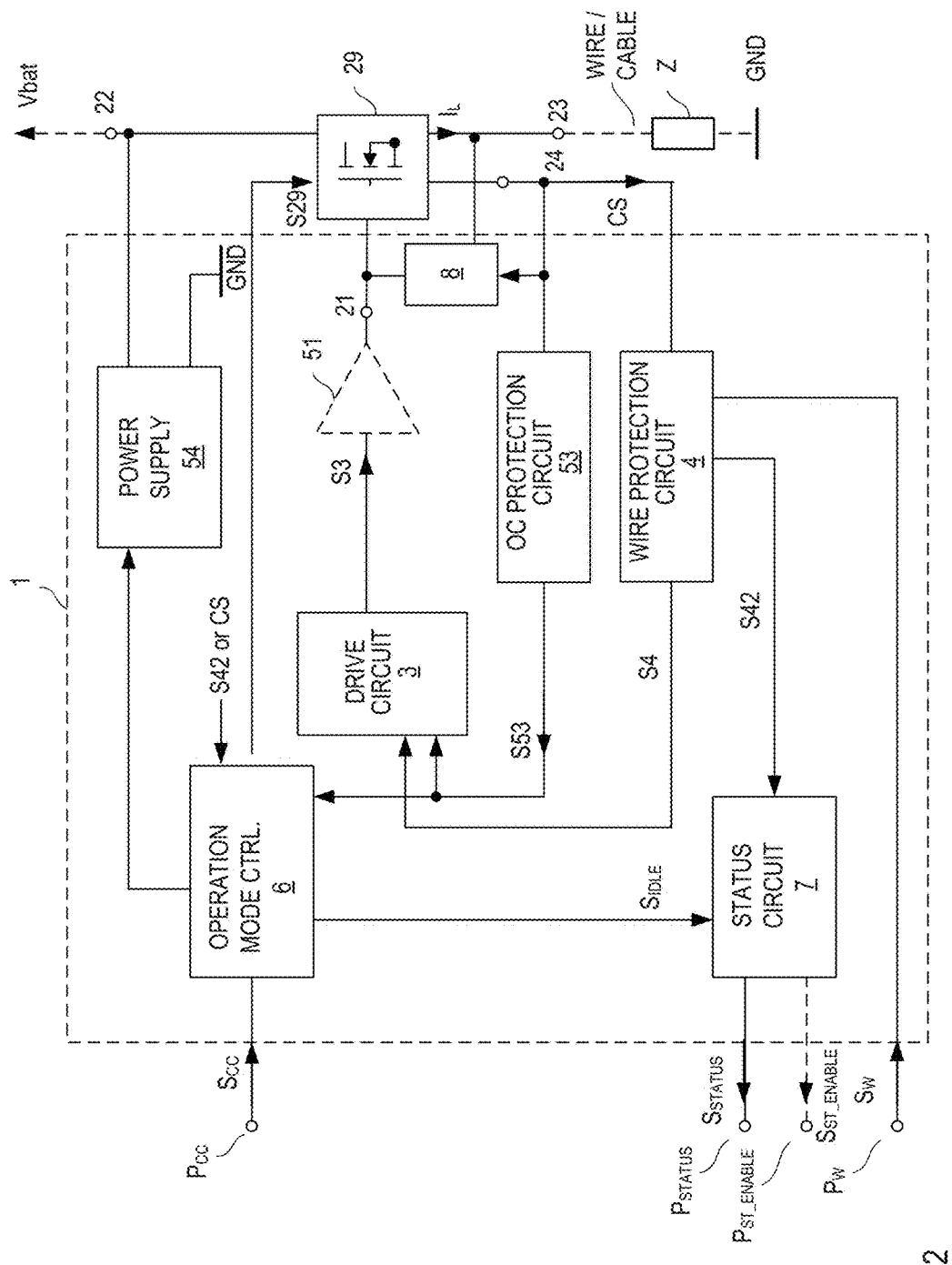
FIG. 32 shows an electronic circuit with a control circuit according to another example.

In the examples explained above the control circuit 1 includes an input and is configured to drive the electronic switch 2 based on a signal level of the input signal $S_{IN}$ received at the input. According to another example, the input is omitted and the control circuit drives the electronic switch 2 based on a supply voltage received by the control circuit 1. This is explained with reference to FIG. 32 below. The electronic circuit shown in FIG. 32 is based on the electronic circuit shown in FIG. 26. However, the concept of driving the electronic switch 2 based on the supply voltage instead of an input signal $S_{IN}$ can be applied to each of the other electronic circuits explained above as well.

In the electronic circuit shown in FIG. 32, a power supply circuit 54 receives the supply voltage. According to one example, the control circuit 1 is configured to switch on the electronic switch 2 as soon as the supply voltage received by the power supply is high enough for the power supply to power the other circuits, in particular the drive circuit 3, in the control circuit 1. Equivalently, the control circuit 1 is configured to switch off the electronic switch 2 when the supply voltage falls below a certain supply threshold.

The protection functions explained above, such as the wire protection function, the overcurrent protection function, or the overtemperature protection function, can be implemented in the control circuit in the same way as explained above. That is, the electronic switch 2 is switched off when one of the protection signals has the protection level. According to one example, the control circuit 1 maintains the electronic switch 2 in the off-state after it has been switched off based on one of the protection signals until the control circuit 1 is reset. In this example, resetting the control circuit 1 includes reducing the supply voltage to below the supply threshold and increasing the supply voltage back to above the supply threshold. According to one example, the control circuit is reset only if the supply voltage is below the supply threshold for a predefined time period.

Some of the aspects explained above relate to:

A1. An electronic circuit, including: an electronic switch including a load path; and a control circuit configured to drive the electronic switch, wherein the control circuit is configured to operate in one of a first operation mode and a second operation mode based at least on a level of a load current of the electronic switch, wherein in the first operation mode the control circuit is configured to generate a first protection signal based on a current-time-characteristic of the load current and drive the electronic switch based on the first protection signal, and wherein the control circuit is configured to generate a status signal such that the status signal has a wakeup pulse when the operation mode changes from the second operation mode to the first operation mode and, after the wakeup pulse, a signal level representing a level of the load current.

A2. The electronic circuit of clause A1, wherein the control circuit is configured, in the first operation mode, to continuously output the signal level representing the level of the load current at a status output of the electronic circuit.

A3. The electronic circuit of clause A1 or A2, wherein the control circuit is configured to receive a polling signal; and in the first operation mode, to output the signal level representing the level of the load current only upon request by the polling signal.

A4. The electronic circuit of clause A3, wherein the control circuit is further configured, in the second operation mode, to output a status pulse different from the wakeup pulse upon request by the polling signal.

A5. The electronic circuit of one of clauses A1 to A4, wherein the control circuit is configured to change operation from the second operation mode to the first operation mode when the load current reaches a predefined threshold.

A6. The electronic circuit of one of clauses A1 to A5, wherein the control circuit includes a first protection circuit configured to generate the first protection signal and including: an analog-to-digital converter (ADC) configured to receive an ADC input signal representing the load current and to output an ADC output signal that includes a sequence of values such that each of the values represents a respective sample of the ADC input signal; a filter configured to receive the ADC output signal and output a filter signal; and a comparator circuit configured to generate the first protection signal based on comparing the filter output signal with a predefined threshold.

A7. The electronic circuit of clause A6, wherein the ADC is a logarithmic ADC configured to generate the ADC output signal such that the values of the sequence of values represents the logarithm of a respective sample of the ADC input signal.

A8. The electronic circuit of clause A6, wherein the control circuit being configured to output a signal level representing a level of the current through the load path includes the control circuit being configured to output the ADC output signal.

A9. The electronic circuit of one of clauses A1 to A8, wherein the control circuit further includes an input configured to receive an input signal, and wherein the control circuit is configured to drive the electronic switch based on the input signal in both the first operation mode and the second operation mode.

A10. The electronic circuit of one of clauses A1 to A9, wherein the control circuit is configured to generate the first protection signal in the first operation and not in the second operation mode.

A11. The electronic circuit of one of clauses A1 to A10, further including: a current measurement circuit configured to measure the load current and provide a current measurement signal proportional to the load current, wherein the control circuit being configured to operate the electronic circuit in a first operation mode or a second operation mode based on the load current includes the control circuit being configured to operate the electronic circuit in the first operation mode or the second operation mode based on the current measurement signal.

A12. The electronic circuit of clause A11, wherein the control circuit includes an ADC configured to provide an ADC output signal based on the current measurement signal, and wherein the control circuit being configured to operate in the first operation mode or the second operation mode based on the current measurement signal includes the control circuit being configured to operate in the first operation mode or the second operation mode based on the ADC output signal.

A13. The electronic circuit of clause A11, wherein the control circuit is configured to adjust a proportionality factor between the load current and the current measurement signal to have a first value in the first operation mode and a second value lower than the first value in the second operation mode.

A14. A method, including: generating a first protection signal based on a current-time-characteristic of a load current through a load path of an electronic switch in an electronic circuit; operating the electronic circuit in one of a first operation mode and a second operation mode at least based on a level of the load current; and generating a status signal such that the status signal, when operation changes from the second operation mode to the first operation mode, has a wakeup pulse and, after the wakeup pulse, a signal level representing a level of the load current.

A15. The method of clause A14, wherein generating the status signal in the first operation mode includes continuously outputting the signal level representing the level of the load current.

A16. The method of clause A14 or A15, wherein generating the status signal in the first operation mode includes: receiving a polling signal by the electronic circuit; and outputting the signal level representing the level of the load current only upon request by the polling signal.

A17. The method of clause A16, further including: in the second operation mode, outputting a status pulse different from the wakeup pulse upon request by the polling signal.

A18. The method of one of clauses A15 to A17, wherein operating the electronic circuit in one of the first operation mode and the second operation mode at least based on the level of the load current includes: changing operation from the second operation mode to the first operation mode when the load current reaches a predefined threshold.

A19. The method of one of clauses A14 to A18, further including: receiving an input signal by the electronic circuit, and driving the electronic switch based on the input signal in both the first operation mode and the second operation mode.

A20. The method of one of clauses A14 to A19, further including: generating the first protection signal in the first operation and not in the second operation mode.

A21. The method of one of clauses A14 to A20, further including: measuring the load current and providing a current measurement signal proportional to the load current, wherein operating the electronic circuit in the first operation mode or the second operation mode based on the load current includes operating the electronic circuit in the first operation mode or the second operation mode based on the current measurement signal.

A22. The method of clause A21, wherein a proportionality factor between the load current and the current measurement signal has a first value in the first operation mode and a second value lower than the first value in the second operation mode.

B1. An electronic circuit, including: an electronic switch including a load path; a first protection circuit configured to generate a first protection signal based on a current-time-characteristic of a load current through the load path of the electronic switch; and a drive circuit configured to drive the electronic switch based on the first protection signal, wherein the first protection circuit includes: a logarithmic analog-to-digital converter (ADC) configured to receive an ADC input signal representing the load current and to output an ADC output signal that includes a sequence of values such that each of the values represents a respective sample of the ADC input signal, a filter configured to filter the ADC output signal and output a filter output signal, and a comparator circuit configured to generate the first protection signal based on comparing the filter output signal with a predefined threshold.

B2. The electronic circuit of clause B1, wherein the filter is configured to calculate a weighted sum of a plurality of successive values of the ADC output signal and generate the filter output signal based on the weighted sum.

B3. The electronic circuit of clause B2, wherein the filter being configured to calculate a weighted sum of a plurality of successive values of the ADC output signal includes calculating one value $S43[k]$ of the filter output signal by $$S43[k]=S42[k]+(1-\alpha)\cdot S43[k-1],$$

where $S42[k]$ is one value of the ADC output signal, $S43[k-1]$ is one previous value of the filter output signal, and $1-\alpha$ is a constant, with $1-\alpha<1$.

B4. The electronic circuit of clause B3, wherein the filter is configured to calculate $(1-\alpha)\cdot S43[k-1]$ only based on or more register shift operations and one or more summations.

B5. The electronic circuit of one of clauses B1 to B4, further including: a first input configured to receive an input signal, wherein the drive circuit is further configured to drive the electronic switch based on the input signal.

B6. The electronic circuit of clause B5, wherein the drive circuit is configured to switch the electronic switch based on the input signal when the first protection signal has an enable level, switch off the electronic switch when the input signal has an on-level and the first protection signal has a disable level, and after the electronic switch has been switched off by a disable level of the first protection signal, switch on the first electronic switch when the first protection signal has a disable level and after the input signal has changed from an off-level to an on-level.

B7. The electronic circuit of one of clauses B1 to B6, further including: a second input configured to receive a signal representing the predefined threshold.

B8. The electronic circuit of one of clauses B1 to B7, further including: a second protection circuit configured to generate a second protection signal based only on a current level of the load path current.

B9. The electronic circuit of one of clauses B1 to B8, further including: a third protection circuit configured to generate a third protection signal based on a temperature of the electronic switch.

B10. The electronic circuit of one of clauses B1 to B9, wherein the electronic switch includes at least one device selected from the group consisting of: a MOSFET; an IGBT; a BJT; a JFET; and a GaN HEMT.

B11. A method, including: generating a first protection signal based on a current-time-characteristic of a current through a load path of an electronic switch; and driving the electronic switch based on the first protection signal, wherein generating the first protection signal includes: by a logarithmic analog-to-digital converter (ADC), receiving an ADC input signal representing the load current and outputting an ADC output signal that includes a sequences of values such that each of the values represents a respective sample of the ADC input signals, filtering the ADC output signal and outputting a filter output signal by a filter, and generating the first protection signal based on comparing the filter output signal with a predefined threshold by a comparator circuit.

B12. The method of clause B11, wherein filtering the ADC output signal by the filter includes calculating a weighted sum of a plurality of successive values of the ADC output signal and generating the filter output signal based on the weighted sum.

B13. The method of clause B12, wherein calculating the weighted sum of a plurality of successive values of the ADC output signal includes calculating one value $S43[k]$ of the filter output signal by $S43[k]=S42[k]+(1-\alpha)\cdot S43[k-1]$, where $S42[k]$ is one value of the ADC output signal, $S43[k-1]$ is one previous value of the filter output signal, and $1-\alpha$ is a constant, with $1-\alpha<1$.

B14. The method of clause B13, wherein calculating $(1-\alpha)\cdot S43[k-1]$ is only based on or more register shift operations and one or more summations.

B15. The method of one of clauses B11 to B14, further including: driving the electronic switch based on an input signal.

B16. The method of clause B15, wherein the driving the electronic switch based on the input signal includes: switching the electronic switch based on the input signal when the first protection signal has an enable level, switching off the electronic switch when the input signal has an on-level and the first protection signal has a disable level, and after the electronic switch has been switched off by a disable level of the first protection signal, switching on the first electronic switch when the first protection signal has a disable level and after the input signal has changed from an off-level to an on-level.

B17. The method of one of clauses B11 to B16, further including: generating a second protection signal based only on a current level of the load path current.

B18. The method of one of clauses B11 to B17, further including: generating a third protection signal based on a temperature of the electronic switch.

B19. The method of one of clauses B11 to B18, wherein the electronic switch includes at least one device selected from the group consisting of: a MOSFET; an IGBT; a BJT; a JFET; and a GaN HEMT.

C1. An electronic circuit, including: an electronic switch including a load path; a first protection circuit configured to generate a first protection signal based on a current-time-characteristic of a load current through the load path of the electronic switch; a drive circuit configured to drive the electronic switch based on the first protection signal, wherein the first protection circuit includes an analog-to-digital converter (ADC) configured to receive an ADC input signal representing the load current, to sample the ADC input signal once in each of a plurality of successive sampling periods, and to output an ADC output signal that includes a sequence of values such that each of the values represents a respective sample of the ADC input signal, wherein the ADC is configured to pseudo-randomly select a sample time in each sampling period.

C2. The electronic circuit of clause C1, wherein the ADC being configured to pseudo-randomly select a sample time in each sampling period including the ADC being configured to select the sample time based on an output signal of a linear feedback shift register.

C3. The electronic circuit of clause C1 or C2, wherein the ADC being configured to pseudo-randomly select a sample time in each sampling period including the ADC being configured to select a sample time from a fixed number of sample times in each sampling period.

C4. The electronic circuit of one of clauses C1 to C3, wherein the ADC is a logarithmic ADC.

C5. The electronic circuit of one of clauses C1 to C4, further including: a first input configured to receive an input signal, wherein the drive circuit is further configured to drive the electronic switch based on the input signal.

C6. The electronic circuit of clause C5, wherein the drive circuit is configured to switch the electronic switch based on the input signal when the first protection signal has an enable level, switch off the electronic switch when the input signal has an on-level and the first protection signal has a disable level, and after the electronic switch has been switched off by a disable level of the first protection signal, switch on the first electronic switch when the first protection signal has a disable level and after the input signal has changed from an off-level to an on-level.

C7. The electronic circuit of one of clauses C1 to C6, wherein the electronic switch includes at least one device selected from the group consisting of: a MOSFET; an IGBT; a BJT; a JFET; and a HEMT.

C8. A method, including: generating a first protection signal based on a current-time-characteristic of a load current through a load path of an electronic switch, wherein generating the first protection signal includes, by an analog-to-digital converter (ADC), receiving an ADC input signal representing the load current, sampling the ADC input signal once in each of a plurality of successive sampling periods, and outputting an ADC output signal that includes a sequence of values such that each of the values represents a respective sample of the ADC input signal, wherein sampling the ADC input signal once in each of a plurality of successive sampling periods includes sampling the ADC input signal at a pseudo-randomly selected sampling time in each sampling period.

C9. The method of clause C8, wherein sampling the ADC input signal at a pseudo-randomly selected sampling time in each sampling period includes selecting the sampling time based on an output signal of a linear feedback shift register.

C10. The method of clause C8 or C9, wherein sampling the ADC input signal at a pseudo-randomly selected sampling time in each sampling period includes selecting a sampling time from a fixed number of sampling times in each sampling period.

C11. The method of one of clauses C8 to C10, wherein the ADC is a logarithmic ADC.

C12. The method of one of clauses C8 to C11, further including: driving the electronic switch based on an input signal.

C13. The method of clause C12, wherein driving the electronic switch based on the input signal includes: switching the electronic switch based on the input signal when the first protection signal has an enable level, switching off the electronic switch when the input signal has an on-level and the first protection signal has a disable level, and after the electronic switch has been switched off by a disable level of the first protection signal, switching on the first electronic switch when the first protection signal has a disable level and after the input signal has changed from an off-level to an on-level.

C14. The method of one of clauses C8 to C13, wherein the electronic switch includes at least one device selected from the group consisting of: a MOSFET; an IGBT; a BJT; a JFET; and a HEMT.

D1. An electronic circuit, including: an electronic switch including a load path; a control circuit configured to drive the electronic switch, wherein the control circuit is configured to operate in one of at least two operation modes, wherein the at least two operation modes include a first operation mode and a second operation mode, wherein the control circuit, in the second operation mode, is configured to perform a set of basic functions and, in the first operation mode, is configured to perform the set of basic functions and at least one additional function, wherein the at least one additional function includes generating a first protection signal based on a current-time-characteristic of a load current of the electronic switch and driving the first electronic switch based on the first protection signal.

D2. The electronic circuit of clause D1, wherein the control circuit is configured to drive the electronic switch based on an input signal in the first operation mode and the second operation mode.

D3. The electronic circuit of clause D1 or D2, wherein the control circuit is configured to drive the electronic switch based on a supply voltage received by the control circuit in the first operation mode and the second operation mode, wherein the supply voltage is configured to power the control circuit.

D4. The electronic circuit of one of clauses D1 to D3, wherein the set of basic functions includes: monitoring the load current and switching off the electronic switch when the load current reaches a predefined overcurrent threshold.

D5. The electronic circuit of one of clauses D1 to D4, wherein the set of basic functions includes: monitoring a temperature of the electronic switch and switching off the electronic switch when the temperature reaches a predefined overtemperature threshold.

D6. The electronic circuit of clause D4 or D5, wherein the at least two operation modes further include a third operation mode, wherein in the third operation mode the control circuit is configured to monitor the load current and regulate the load current when the load current reaches the overcurrent threshold.

D7. The electronic circuit of clause D6, wherein the control circuit being configured to regulate the load current includes the control circuit being configured to regulate the load current to have a target level that substantially equals the overcurrent threshold.

D8. The electronic circuit of one of clauses D1 to D7, wherein the control circuit includes a first protection circuit configured to generate the first protection signal and including: an analog-to-digital converter (ADC) configured to receive an ADC input signal representing the load current and to output an ADC output signal, a filter configured to filter the ADC output signal and output a filter output signal, and a comparator circuit configured to generate the first protection signal based on comparing the filter output signal with a predefined threshold.

D9. The electronic circuit of clause D8, further including: a further input configured to receive a signal representing the predefined threshold.

D10. The electronic circuit of one of clauses D1 to D9, wherein the control circuit further includes a status output, and wherein the control circuit is further configured to generate a wakeup pulse at the status output when operation changes from the second operation mode to the first operation mode.

D11. The electronic circuit of one of clauses D1 to D10, wherein the control circuit is configured to enter the second operation based on the load current and at least one other parameter.

D12. The electronic circuit of clause D11, wherein the at least one other parameter is selected from the group consisting of: a filter output signal in a filter of a first protection circuit configured to generate the first protection signal; a temperature difference between a temperature in the electronic switch and a temperature in the control circuit; an ambient temperature of the electronic circuit; and an on-resistance of the electronic switch.

D13. A method, including: operating a control circuit configured to drive an electronic switch in one of at least two operation modes, wherein the at least two operation modes include a first operation mode and a second operation mode, wherein operating in the second operation mode includes performing a set of basic functions by the control circuit and operating in the first operation mode includes performing the set of basic functions and at least one additional function by the control circuit, wherein the at least one additional function includes generating a first protection signal based on a current-time-characteristic of a load current of the electronic switch and driving the first electronic switch based on the first protection signal.

D14. The method of clause D13, wherein operating in the first operation mode and the second operation mode includes driving the electronic switch based on an input signal by the control circuit.

D15. The method of clause D13 or D14, wherein operating in the first operation mode and the second operation mode includes driving the electronic switch based on a supply voltage received by the control circuit, wherein the supply voltage is configured to power the control circuit.

D16. The method of one of clauses D13 to D15, wherein the set of basic functions includes: monitoring the load current and switching off the electronic switch when the load current reaches a predefined overcurrent threshold.

D17. The method of one of clauses D13 to D16, wherein the set of basic functions includes: monitoring a temperature of the electronic switch and switching off the electronic switch when the temperature reaches a predefined overtemperature threshold.

D18. The method of clause D16 or D17, wherein the at least two operation modes further include a third operation mode, wherein operating in the third operation mode includes monitoring the load current and regulating the load current when the load current reaches the overcurrent threshold by the control circuit.

D19. The method of clause D18, wherein regulating the load current includes regulating the load current to have a target level that substantially equals the overcurrent threshold.

D20. The method of one of clause D13 to D19, further including: generating a wakeup pulse at a status output by the control circuit when operation changes from the second operation mode to the first operation mode.

D21. The method of one of clauses D13 to D20, further including: entering the second operation by the control circuit based on the load current and at least one other parameter.

D22. The method of clause D21, wherein the at least one other parameter is selected from the group consisting of: a filter output signal in a filter of a first protection circuit configured to generate the first protection signal; a temperature difference between a temperature in the electronic switch and a temperature in the control circuit; an ambient temperature of the electronic circuit; and an on-resistance of the electronic switch.

E1. An electronic circuit, including: an electronic switch including a load path; a control circuit configured to drive the electronic switch and configured to operate in one of a first operation mode and a test mode, wherein the control circuit includes a test mode input and is configured to operate in the test mode based on a test signal received at the test input, and wherein the control circuit in the first operation mode is configured to generate a first protection signal based on a current-time-characteristic of a load current of the electronic switch and drive the first electronic switch based on the first protection signal.

E2. The electronic circuit of clause E1, wherein the control circuit is configured to determine a duty cycle of the test signal and to test one of at least two different functions of the control circuit based on the determined duty cycle in order to obtain a test result.

E3. The electronic circuit of clause E1 or E2, wherein the control circuit includes a status output, and wherein the control circuit, in the test mode, is configured to output a status signal at the status output.

E4. The electronic circuit of clause E3, wherein the control circuit is configured to vary a signal level of the status signal dependent on a test result.

E5. The electronic circuit of clause E4, wherein the control circuit is configured to output a pass level if the test result indicates that the function has passed the test, and output a fail level if the test result indicates that the function has failed the test.

E6. The electronic circuit of clause E4 or E5, wherein the fail level is independent of the tested function.

E7. The electronic circuit of one of clauses E4 to E6, wherein the pass level is dependent of the tested function.

E8. The electronic circuit of one of clauses E1 to E7, wherein the control circuit further includes a drive input configured to receive an input signal, wherein the control circuit is configured to drive the electronic switch based on the input signal in the first operation mode.

E9. The electronic circuit of clause E8, wherein the control circuit is configured, in the test mode, to generate one of the pass level and the fail level only if the input signal has an on-level.

E10. The electronic circuit of clause E8 or E9, wherein the control circuit is configured, in the test mode, to output a signal level different from the pass level, the fail level and zero if the input signal has an off-level.

E11. A method, including: operating a control circuit configured to drive an electronic switch in one of a first operation mode and a test mode, wherein operating the control circuit in the test mode includes operating the control circuit in the test mode based on a test signal received at a test input of the control circuit, and wherein operating the control circuit in the first operation mode includes generating a first protection signal based on a current-time-characteristic of a load current of the electronic switch and driving the first electronic switch based on the first protection signal by the control circuit.

E12. The method of clause E11, wherein operating the control circuit in the test mode includes determining a duty cycle of the test signal and testing one of at least two different functions of the control circuit based on the determined duty cycle in order to obtain a test result.

E13. The method of clause E11 or E12, wherein operating the control circuit in the test mode includes outputting a status signal at a status output.

E14. The method of clause E13, wherein outputting the status signal at a status output includes varying a signal level of the status signal dependent on a test result.

E15. The method of clause E14, wherein varying a signal level of the status signal dependent on a test result includes: outputting a pass level if the test result indicates that the function has passed the test, and outputting a fail level if the test result indicates that the function has failed the test.

E16. The method of clause E15, wherein the fail level is independent of the tested function.

E17. The method of clause E15 or E16, wherein the pass level is dependent of the tested function.

E18. The method of one of clauses E11 to E17, wherein operating the control circuit in the first operation mode includes: driving the electronic switch based on an input signal.

E19. The method of clause E18, wherein operating the control circuit in the test mode includes generating one of the pass level and the fail level only if the input signal has an on-level.

E20. The method of clause E18 or E19, wherein operating the control circuit in the test mode includes outputting a signal level different from the pass level, the fail level and zero if the input signal has an off-level.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronic circuit, comprising:
an electronic switch comprising a load path;
a first protection circuit configured to generate a first protection signal based on a current-time-characteristic of a load current through the load path of the electronic switch; and
a drive circuit configured to drive the electronic switch based on the first protection signal,
wherein the first protection circuit comprises:
a logarithmic analog-to-digital converter (ADC) configured to receive an ADC input signal representing the load current and to output an ADC output signal that includes a sequence of values such that each of the values represents a respective sample of the ADC input signal,
a filter configured to filter the ADC output signal and output a filter output signal, and
a comparator circuit configured to generate the first protection signal based on comparing the filter output signal with a predefined threshold
wherein the filter is configured to calculate a weighted sum of a plurality of successive values of the ADC output signal and generate the filter output signal based on the weighted sum, and
wherein the filter being configured to calculate a weighted sum of a plurality of successive values of the ADC output signal comprises calculating one value S43[k] of the filter output signal by $$S43[k]=S42[k]+(1-\alpha)\cdot S43[k-1]$$

where S42[k] is one value of the ADC output signal, S43[k−1] is one previous value of the filter output signal, and 1−α is a constant, with 1−α<1.

2. The electronic circuit of claim 1, wherein the filter is configured to calculate $(1-\alpha)\cdot S_{43}[k-1]$ only based on or more register shift operations and one or more summations.

3. The electronic circuit of claim 1, further comprising:
a first input configured to receive an input signal,
wherein the drive circuit is further configured to drive the electronic switch based on the input signal.

4. The electronic circuit of claim 3, wherein the drive circuit is configured to
switch the electronic switch based on the input signal when the first protection signal has an enable level,
switch off the electronic switch when the input signal has an on-level and the first protection signal has a disable level, and
after the electronic switch has been switched off by a disable level of the first protection signal, switch on the electronic switch when the first protection signal has a disable level and after the input signal has changed from an off-level to an on-level.

5. The electronic circuit of claim 1, further comprising:
a second input configured to receive a signal representing the predefined threshold.

6. The electronic circuit of claim 1, further comprising:
a second protection circuit configured to generate a second protection signal based only on a current level of the load path current.

7. The electronic circuit of claim 1, further comprising:
a third protection circuit configured to generate a third protection signal based on a temperature of the electronic switch.

8. The electronic circuit of claim 1, wherein the electronic switch comprises at least one device selected from the group consisting of:
a MOSFET;
an IGBT;
a BJT;
a JFET; and
a GaN HEMT.

9. A method, comprising:
generating a first protection signal based on a current-time-characteristic of a current through a load path of an electronic switch; and
driving the electronic switch based on the first protection signal,
wherein generating the first protection signal comprises:
by a logarithmic analog-to-digital converter (ADC), receiving an ADC input signal representing the load path current and outputting an ADC output signal that includes a sequences of values such that each of the values represents a respective sample of the ADC input signals,
filtering the ADC output signal and outputting a filter output signal by a filter, and
generating the first protection signal based on comparing the filter output signal with a predefined threshold by a comparator circuit filtering the ADC output signal by the filter comprises calculating a weighted sum wherein of a plurality of successive values of the ADC output signal and generating the filter output signal based on the weighted sum, and
wherein calculating the weighted sum of a plurality of successive values of the ADC output signal comprises calculating one value S43[k] of the filter output signal by $$S43[k]=S42[k]+(1-\alpha)\cdot S43[k-1]$$

where S42[k] is one value of the ADC output signal, S43[k−1] is one previous value of the filter output signal, and 1−α is a constant, with 1−α<1.

10. The method of claim 9, wherein calculating (1−α)·S$_{43}$[k−1] is only based on or more register shift operations and one or more summations.

11. The method of claim 9, further comprising:
driving the electronic switch based on an input signal.

12. The method of claim 11, wherein the driving the electronic switch based on the input signal comprises:
switching the electronic switch based on the input signal when the first protection signal has an enable level,
switching off the electronic switch when the input signal has an on-level and the first protection signal has a disable level, and
after the electronic switch has been switched off by a disable level of the first protection signal, switching on the electronic switch when the first protection signal has a disable level and after the input signal has changed from an off-level to an on-level.

13. The method of claim 9, further comprising:
generating a second protection signal based only on a current level of the load path current.

14. The method of claim 9, further comprising:
generating a third protection signal based on a temperature of the electronic switch.

15. The method of claim 9, wherein the electronic switch comprises at least one device selected from the group consisting of:
a MOSFET;
an IGBT;
a BJT;
a JFET; and
a GaN HEMT.

16. The electronic circuit of claim 1, wherein the logarithmic ADC is configured to generate each value of the ADC output signal based on comparing each respective sample of the ADC input signal with a plurality of reference voltages, wherein each but one of the plurality of reference voltages is a multiple of a next lower reference voltage.

17. The method of claim 9, wherein the logarithmic ADC is configured to generate each value of the ADC output signal based on comparing each respective sample of the ADC input signal with a plurality of reference voltages, wherein each but one of the plurality of reference voltages is a multiple of a next lower reference voltage.

18. The method of claim 9, wherein the logarithmic ADC comprises an input coupled to a current sense node of the electronic switch.

19. The method of claim 9, further comprising generating, by the electronic switch, a first current, wherein the first current is proportional to the load path current.

20. The method of claim 19, further comprising:
converting, by a current-to-voltage converter, the first current to a first voltage; and
providing the first voltage to an input of the logarithmic ADC.

21. The electronic circuit of claim 1, wherein the logarithmic ADC comprises an input coupled to a current sense node of the electronic switch.

22. The electronic circuit of claim 21, further comprises a current-to-voltage converter coupled between the current sense node of the electronic switch and the input of the logarithmic ADC.

23. The electronic circuit of claim 21, wherein the current sense node of the electronic switch is coupled to a current measurement output of the electronic switch, the current measurement output configured to produce a current proportional to a current flowing through the electronic switch.

* * * * *